United States Patent
Minakais

(10) Patent No.: US 12,216,411 B2
(45) Date of Patent: Feb. 4, 2025

(54) PREDICTIVE APPARATUS IN A GAS DISCHARGE LIGHT SOURCE

(71) Applicant: Cymer, LLC, San Diego, CA (US)

(72) Inventor: Matthew Minakais, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 270 days.

(21) Appl. No.: 17/782,283

(22) PCT Filed: Dec. 1, 2020

(86) PCT No.: PCT/US2020/062742
§ 371 (c)(1),
(2) Date: Jun. 3, 2022

(87) PCT Pub. No.: WO2021/126520
PCT Pub. Date: Jun. 24, 2021

(65) Prior Publication Data
US 2023/0020555 A1  Jan. 19, 2023

Related U.S. Application Data

(60) Provisional application No. 62/949,723, filed on Dec. 18, 2019.

(51) Int. Cl.
*G03F 7/00* (2006.01)
(52) U.S. Cl.
CPC .............................. *G03F 7/70591* (2013.01)
(58) Field of Classification Search
CPC ... G03F 7/70033; G03F 7/70591; H01S 3/036
See application file for complete search history.

(56) References Cited

U.S. PATENT DOCUMENTS

| 10,234,769 B2 | 3/2019 | Dorobantu et al. |
| 2004/0190008 A1* | 9/2004 | Mieher ............ G01N 21/95607 356/625 |
| 2015/0188278 A1 | 7/2015 | Roy |

(Continued)

FOREIGN PATENT DOCUMENTS

| CN | 109783834 A * | 5/2019 | ............... G03F 1/36 |
| JP | H021189 A | 1/1990 | |

(Continued)

OTHER PUBLICATIONS

Ole Andersen, European International Searching Authority, International Search Report and Written Opinion, counterpart PCT Application No. PCT/US2020/062742, mailed Mar. 31, 2021, 11 pages total.

(Continued)

*Primary Examiner* — Maurice C Smith
(74) *Attorney, Agent, or Firm* — DiBerardino McGovern IP Group LLC

(57) ABSTRACT

An apparatus includes a decision module that is configured to: receive a performance metric relating to performance conditions of an optical system emitting a light beam; estimate, based on the performance metric and a predetermined learning model, an effectiveness of a proposed change to the optical system; and output a change command to the optical system if it is estimated that the proposed change to the optical system would be effective.

32 Claims, 11 Drawing Sheets

(56) References Cited

U.S. PATENT DOCUMENTS

2017/0220927 A1  8/2017  Takigawa et al.
2022/0082949 A1  3/2022  Hubaux et al.

FOREIGN PATENT DOCUMENTS

WO  2017055073 A1  4/2017
WO  2018171982 A1  9/2018
WO  2019240906 A1  12/2019

OTHER PUBLICATIONS

Corinna Cortes et al., "Support-Vector Networks," Machine Learning, vol. 20, pp. 273-297 (1995), 25 pages total.
Support-vector machine, Wikipedia retrieved Jul. 10, 2019, from https://en.wikipedia.org/w/index.php?title=Support-vector_machine&oldid=905324675, 16 pages total.

* cited by examiner

|       | F101 | F102 | F103 | ... | F132 |
|-------|------|------|------|-----|------|
| BQ 1  | 1.54 | 0.29 | 0.03 | ... | 0.00 |
| BQ 2  | 0.81 | 1.40 | 0.12 | ... | 0.43 |
| BQ 3  | 1.29 | 0.33 | 0.56 | ... | 0.07 |
| BQ 4  | 0.00 | 0.00 | 1.82 | ... | 0.00 |
| ...   | ...  | ...  | ...  | ... | ...  |
| BQ N  | 2.27 | 0.16 | 0.83 | ... | 0.11 |

|       | F101 | F102 | F103 | ... | F132 |
|-------|------|------|------|-----|------|
| BQ 1  | 1 | 0 | 0 | ... | 0 |
| BQ 2  | 0 | 1 | 0 | ... | 0 |
| BQ 3  | 1 | 0 | 0 | ... | 0 |
| BQ 4  | 0 | 0 | 1 | ... | 0 |
| ...   | ... | ... | ... | ... | ... |
| BQ N  | 1 | 0 | 0 | ... | 0 |

| $K_{FSD}$ | Sum(F101)/N | Sum(F102)/N | Sum(F103)/N | ... | Sum(F132)/N |

| $\kappa c1$ | $\Delta cp1$ | Gas component 1 concentration |
|---|---|---|
| $\kappa c2$ | $\Delta cp2$ | Gas component 2 concentration |
| $\kappa c3$ | $\Delta cp3$ | Injection 1 property |
| $\kappa c4$ | $\Delta cp4$ | Injection 2 property |
| $\kappa c5$ | $\Delta cp5$ | Energy supply gas mixture 1 |
| $\kappa c6$ | $\Delta cp6$ | Energy supply gas mixture 2 |
| $\kappa c7$ | $\Delta cp7$ | Energy supply gas mixture 3 |
| $\kappa c8$ | $\Delta cp8$ | Target temperature 1 |
| $\kappa c9$ | $\Delta cp9$ | Target temperature 2 |
| $\kappa c10$ | $\Delta cp10$ | Chamber environment 1 |
| $\kappa c11$ | $\Delta cp11$ | Chamber environment 2 |

Fig. 12

PREDICTIVE APPARATUS IN A GAS DISCHARGE LIGHT SOURCE

CROSS REFERENCE TO RELATED APPLICATIONS

This application claims priority to U.S. Application No. 62/949,723 filed Dec. 18, 2019 and titled PREDICTIVE APPARATUS IN A GAS DISCHARGE LIGHT SOURCE, which is incorporated herein in its entirety by reference.

TECHNICAL FIELD

This disclosure relates to an apparatus using a prediction model that predicts whether changes to an optical source of an optical lithography system would improve operating conditions of the optical source.

BACKGROUND

One kind of gas discharge light source used in photolithography is termed an excimer light source or laser. Typically, an excimer laser uses a combination of one or more noble gases, which can include argon, krypton, or xenon, and a reactive gas, which can include fluorine or chlorine. The excimer laser can create an excimer, a pseudo-molecule, under appropriate conditions of electrical simulation (energy supplied) and high pressure (of the gas mixture), the excimer only existing in an energized state. The excimer in an energized state gives rise to amplified light in the ultraviolet range. An excimer light source can use a single gas discharge chamber or a plurality of gas discharge chambers. When the excimer light source is performing, the excimer light source produces a deep ultraviolet (DUV) light beam. DUV light can include wavelengths from, for example, about 100 nanometers (nm) to about 400 nm.

The DUV light beam can be directed to a photolithography exposure apparatus or scanner, which is a machine that applies a desired pattern onto a target portion of a substrate (such as a silicon wafer). The DUV light beam interacts with a projection optical system, which projects the DUV light beam through a mask onto the photoresist of the wafer. In this way, one or more layers of chip design is patterned onto the photoresist and the wafer is subsequently etched and cleaned.

SUMMARY

In some general aspects, an apparatus includes a decision module configured to: receive a performance metric relating to performance conditions of an optical system emitting a light beam; estimate, based on the performance metric and a predetermined learning model, an effectiveness of a proposed change to the optical system; and output a change command to the optical system if it is estimated that the proposed change to the optical system would be effective.

Implementations can include one or more of the following features. For example, the decision module can be configured to output a maintain command to the optical system if the decision module estimates that the proposed change to the optical system would not be effective.

The decision module can be configured to estimate the effectiveness of the proposed change by determining whether the performance conditions of the light beam would be improved. The decision module can determine whether the performance conditions of the light beam are improved by determining whether a rate of errors in the beam quality would be reduced.

The performance conditions can include one or more of: types of beam quality errors in the light beam, number of occurrences of a discharge event in the gas mixture over a period of time, one or more faults associated with the errors in beam quality of the light beam, the beam quality of the light beam, and errors in the beam quality of the light beam. The performance conditions can include a configuration of the optical system, including a configuration relating to one or more chambers that contain the gas mixture, such as, a pressure, a temperature, a setting, or an operating mode associated with the one or more chambers containing the gas mixture. The performance conditions can include error events associated with operating parameters or characteristics of the light beam, analyses of each error event relative to fault signatures, and changes in a configuration of the optical system.

The decision module can be configured to estimate the effectiveness of the proposed change prior to the change to the optical system being effected.

The apparatus can include an interface module in communication with the decision module, the interface module providing the performance metric. The interface module includes a plurality of analysis sub-modules. The plurality of analysis sub-modules includes beam quality detection sub-modules including: one or more spectral feature detection modules each configured to detect an error in a respective spectral feature of the light beam and to produce an error event signal that indicates the respective spectral feature error of the light beam; and an energy detection module configured to detect an error in an energy of the light beam and to produce an error event signal that indicates the energy error of the light beam. The spectral feature can include a bandwidth or a wavelength of the light beam and the performance metric can be produced based on the error events in the respective spectral features and energy. The interface module can include: a discharge count detection module configured to detect an occurrence of a discharge event in a gas mixture of the optical system, and to produce an error event signal that indicates a count of discharge events over a period of time. The performance metric can include data relating to the produced signal from the discharge detection module. The period of time can be measured since the last time the gas mixture was refilled. The period of time can be measured since one or more chambers containing the gas mixture are replaced with one or more new chambers in the optical system. The interface module can include: a fault signature module configured to analyze each beam quality error event relative to a set of fault signatures and to produce a likelihood score that classifies the beam quality error event into known fault signatures. The performance metric can include data relating to the output from the fault signature module.

The predetermined learning model can receive as an input the performance metric and can output the estimate. The predetermined learning model can include a support vector machine. The predetermined learning model can include a separating hyperplane, the hyperplane classifying the performance metric as either a yes or a no, in which a yes classification indicates that the proposed change would be effective and a no classification indicates that the proposed change would not be effective.

The predetermined learning model can be built based on a type, a configuration, and/or an age of the optical system.

The estimate of the effectiveness of the proposed change can indicate whether performance conditions of the optical system after the proposed change improve relative to the conditions of the optical system prior to the proposed change.

The decision module can be configured to estimate the effectiveness of the proposed change by comparing performance conditions of the optical system after the proposed change to performance conditions of the optical system before the proposed change. The decision module can be configured to output the change command if the comparison indicates that the performance conditions would improve by a predetermined amount.

The proposed change to the optical system can include one or more of a proposed refill of a gas mixture within the optical system and a proposed change in a configuration of the optical system. The decision module can be configured to estimate the effectiveness of a proposed refill of the gas mixture within the optical system based also on probed changes to the configuration of the optical system.

In other general aspects, a method includes: receiving a training dataset based on a plurality of test optical systems, and generating, based on the training dataset, a prediction model that estimates an effectiveness of a proposed change to an optical system based on a performance metric relating to performance conditions of the optical system. The training dataset includes, for each of a plurality of changes to each test optical system: a plurality of values of performance conditions relating to the test optical system prior to the change; and a plurality of values of the performance conditions relating to the test optical system after the change.

Implementations can include one or more of the following features. For example, prediction model can be generated by comparing, for each change to a test optical system, the plurality of values of the performance conditions relating to the test optical system after the change to the plurality of values of the performance conditions relating to the test optical system prior to the change, the comparison indicating the effectiveness of the change.

The prediction model can be a learning model. The learning model can include a support vector machine. The learning model can be any structure other than a support vector machine, as long as it can be used as the prediction model. In particular, aspects of the learning model include assembling a dataset, assembling an input vector with fault signature detection (FSD), training the dataset, testing the dataset, and then applying the learning model. For example, in other implementations, the learning model includes a neural network, a decision tree, or a K-nearest neighbor model.

The prediction model can be generated by mapping the performance metric to one of a maintain command or a change command, the maintain command and the change command being based on the estimated effectiveness of the proposed change to the optical system.

The training dataset can include at least several thousand changes to the plurality of test optical systems.

The performance conditions can include one or more of: rates of beam quality errors of a light beam produced from the optical system, types of beam quality errors of a light beam produced from the optical system, number of occurrences of a discharge event in the gas mixture of the optical system over a period of time, one or more faults associated with the errors in the beam quality of the light beam produced from the optical system, anomalies in operating efficiency of the optical system, and errors in one or more spectral features of the light beam produced from the optical system. The performance conditions can include one or more error events associated with operating parameters or characteristics of the light beam, analyses of each error event relative to fault signatures, and changes in a configuration of the optical system.

The method can also include testing the prediction model before applying a performance metric relating to performance conditions of the optical system to the prediction model. The prediction model can be tested by: using a test dataset that includes, for each of a plurality of changes to each of a plurality of test optical systems and each of a plurality of test optical systems, a plurality of values of performance conditions relating to the test optical system prior to the change and a plurality of values of the performance conditions relating to the test optical system after the change, the test dataset being excluded from the training dataset, and applying the plurality of values of performance conditions relating to the test optical system prior to the change to the prediction model and comparing each actual output of the prediction model to the associated value of the performance condition relating to the test optical system after the change from the test dataset.

The estimate of the effectiveness of the proposed change can indicate whether performance conditions of the optical system after the proposed change improve relative to the conditions of the optical system prior to the proposed change.

The method can also include tuning the prediction model to reduce a likelihood that the prediction model estimates that the proposed change would not be effective.

The prediction model can be generated based on a type, a configuration, and/or an age of the optical system.

The prediction model can be configured to estimate the effectiveness of the proposed gas change to the optical system that is among or distinct from the test optical systems.

The proposed change to the optical system can include one or more of a proposed refill of a gas mixture within the optical system and a proposed change in a configuration of the optical system.

In other general aspects, a method includes: receiving a performance metric relating to performance conditions of an optical system emitting a light beam; estimating, based on the performance metric and a predetermined learning model, an effectiveness of a proposed change to the optical system; and instructing a change to the optical system if it is estimated that the proposed change would be effective.

Implementations can include one or more of the following features. For example, the change to the optical system can be instructed by outputting a change command to the optical system.

The method can further include delaying the change if it is estimated that the proposed change would not be effective. The change can be delayed by outputting a maintain command to the optical system.

The method can also include, after delaying the change: receiving a performance metric relating to performance conditions of the optical system; and estimating, based on the performance metric and the predetermined learning model, the effectiveness of a proposed change to the optical system.

The effectiveness of the proposed change can be estimated by determining whether the performance conditions of the light beam would be improved by performing the change. The determination whether the performance conditions of the light beam are improved can include determining whether a rate of errors in the beam quality would be reduced due to the change.

The performance conditions can include one or more of: types of beam quality errors in the light beam, number of occurrences of a discharge event in the gas mixture over a period of time, one or more faults associated with the errors in beam quality of the light beam, the beam quality of the light beam, and errors in the beam quality of the light beam. The performance conditions can include one or more of error events associated with operating parameters or characteristics of the light beam, analyses of each error event relative to fault signatures, and changes in a configuration of the optical system.

The predetermined learning model can be configured to estimate the effectiveness of the proposed change prior to effecting the change to the optical system.

The performance conditions can include a count of discharge events in the gas mixture over a period of time.

The predetermined learning model can receive as an input the performance metric and outputs the estimate.

The predetermined learning model can include a support vector machine. The predetermined learning model can include a separating hyperplane, the hyperplane classifying the performance metric as either a yes or a no, in which a yes classification indicates that the proposed change would be effective and a no classification indicates that the proposed change would not be effective. The estimate of the effectiveness of the proposed change can indicate whether conditions of the optical system after the proposed change improve relative to the conditions of the optical system prior to the proposed change. The gas mixture can include a gain medium in which a population inversion is configured to occur by way of stimulated emission when energy is provided to the gas mixture.

The proposed change to the optical system can include one or more of a proposed refill of a gas mixture within the optical system and a proposed change in a configuration of the optical system.

In other general aspects, a non-transitory computer-readable medium stores instructions that, when executed by a computer, cause it to perform the following method including: receiving a training dataset based on a plurality of test optical systems, the training dataset includes, for each of a plurality of changes of each test optical system: a plurality of values of performance conditions relating to the test optical system prior to the change; and a plurality of values of the performance conditions relating to the test optical system after the change; and generating, based on the training dataset, a prediction model that estimates an effectiveness of a proposed change in an optical system based on a performance metric relating to performance conditions of the optical system. The optical system can be among or distinct from the test optical systems.

In other general aspects, a non-transitory computer-readable medium stores instructions that, when executed by a computer, cause it to perform the following method including: receiving a performance metric relating to performance conditions of an optical system emitting a light beam; estimating, based on the performance metric and a predetermined learning model, an effectiveness of a proposed change to the optical system; and instructing a change to the optical system if it is estimated that the proposed change would be effective.

In other general aspects, an apparatus includes a decision module configured to: receive a performance metric relating to performance conditions of an optical system emitting a light beam; estimate, based on the performance metric and a predetermined learning model, an effectiveness of a proposed refill of a gas mixture of the optical system; and output a refill command to the optical system if it is estimated that the proposed refill of the gas mixture of the optical system would be effective.

In further general aspects, a method includes: receiving a training dataset based on a plurality of test optical systems, the training dataset includes, for each of a plurality of gas refills of each test optical system: a plurality of values of performance conditions relating to the test optical system prior to the gas refill; and a plurality of values of the performance conditions relating to the test optical system after the gas refill; and generating, based on the training dataset, a prediction model that estimates an effectiveness of a proposed gas refill of a gas mixture in an optical system based on a performance metric relating to performance conditions of the optical system. The optical system can be among or distinct from the test optical systems.

In other general aspects, a method includes: receiving a performance metric relating to performance conditions of an optical system emitting a light beam; estimating, based on the performance metric and a predetermined learning model, an effectiveness of a proposed gas refill of a gas mixture of the optical system; and instructing a gas refill to the optical system if it is estimated that the proposed gas refill would be effective.

In further general aspects, a non-transitory computer-readable medium stores instructions that, when executed by a computer, cause it to perform the following method including: receiving a training dataset based on a plurality of test optical systems, the training dataset includes, for each of a plurality of gas refills of each test optical system: a plurality of values of performance conditions relating to the test optical system prior to the gas refill; and a plurality of values of the performance conditions relating to the test optical system after the gas refill; and generating, based on the training dataset, a prediction model that estimates an effectiveness of a proposed gas refill in an optical system based on a performance metric relating to performance conditions of the optical system, wherein the optical system is distinct from the test optical system.

In even other general aspects, a non-transitory computer-readable medium stores instructions that, when executed by a computer, cause it to perform the following method including: receiving a performance metric relating to performance conditions of an optical system emitting a light beam; estimating, based on the performance metric and a predetermined learning model, an effectiveness of a proposed gas refill in the optical system; and instructing a gas refill to the optical system if it is estimated that the proposed gas refill would be effective.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

BRIEF DESCRIPTION OF THE DRAWINGS

FIG. 12 is a table of an example of a set of configuration parameters changes, each configuration parameter change corresponding to a performance condition of the optical system.

DETAILED DESCRIPTION

Figure 1:
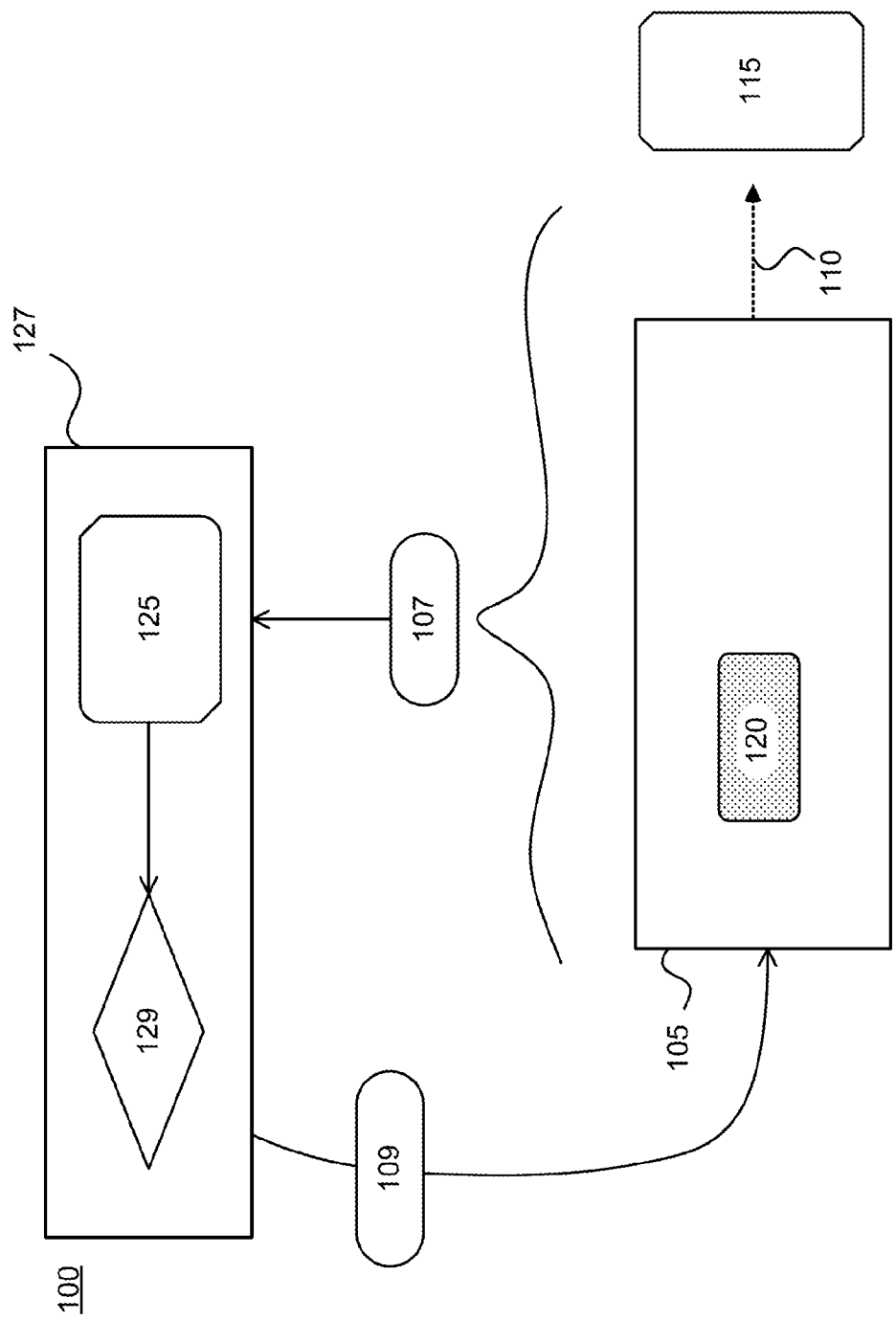
FIG. 1 is a block diagram of a predictive apparatus configured to predict whether a proposed change to an optical system would improve operation of the optical system based at least in part on performance conditions of the optical system.

Referring to FIG. 1, a monitoring apparatus 100 monitors operation of an optical system 105 that produces a light beam 110 for use by an output apparatus 115. The monitoring apparatus 100 predicts whether a proposed change to the optical system 105 would improve operation of the optical system 105. For example, a proposed change can be a proposed gas refill of a gas mixture 120 within the optical system 105. The monitoring apparatus 100 makes this prediction at least in part based on performance conditions of the optical system 105. In particular, machine learning is used to create a predetermined learning model 125, and the monitoring apparatus 100 uses this predetermined learning model 125 to determine or estimate which performance conditions are more or most relevant to the health or operation of optical system 105. For example, if the proposed change is a proposed gas refill of the gas mixture 120, then the predetermined learning model 125 determines or estimates which performance conditions are more relevant to the health or operation of the gas mixture 120. In this manner, the monitoring apparatus 100 is able to identify or predict an effectiveness 129 of the proposed gas refill, that is whether the optical system 105 would be positively impacted by the proposed gas refill of the gas mixture 120. As another example, if the proposed change is a change in a configuration of the optical system 105, then the predetermined learning model 125 determines whether the proposed change in the configuration of the optical system 105 would improve operation of the optical system 105.

In the drawings, solid lines connecting two elements indicate a data path over which data (for example, information and/or command signals) can flow. Data can flow over a wireless or a wired connection. Moreover, dashed lines indicate an optical path along which light can propagate and double lines (shown, for example, in FIG. 3) indicate a fluid path along which fluid can flow.

The output apparatus 115 can be a photolithography system (also referred to as a scanner) and the light beam 110 can be a pulsed light beam that is used by the scanner to expose wafers. The pulsed light beam 110 is a train of pulses of light, with each pulse being formed by exciting the gas mixture 120. The pulsed light beam 110 has a repetition rate. The repetition rate is the number of pulses of light that occur within a measure of time. For example, the repetition rate can be the number of pulses of light that occur within one second. The repetition rate is determined by the number of times that a gain medium within the gas mixture 120 is excited within the measure of time. Additionally, the pulsed light beam 110 is associated with one or more specifications related to the quality of the pulsed light beam 110. The specifications can include, for example, acceptable values and/or ranges of values for various properties of the pulsed light beam 110. For example, the specifications can include values related to pulse energy, wavelength, bandwidth, repetition rate, and/or pulse duration, or values derived from measurements of any of these properties. When the pulsed light beam 110 is within the specification, all of the properties of interest to the application at hand are within the range or are equal to the value for that property as set forth in the specification. When the pulsed light beam 110 is not within specification, one or more of the properties of interest to the application at hand are outside of the range or not equal to the value for that property. The optical system 105 has optimal performance when the light beam 110 is within the specification.

The gas mixture 120 has an actual gas lifetime and an assumed gas lifetime. The actual gas lifetime is a period during which the gas mixture 120 is able to produce pulses of light that are within the specification. The assumed and actual gas lifetimes can be measured as, for example, a total number of pulses produced by the gas mixture 120 or a total time during which the optical system 105 is operated at a specific repetition rate. For example, when the gas mixture 120 reaches the end of its actual gas lifetime, it is possible that the gas mixture 120 is no longer able to produce pulses of light that are within the specification.

Other events can cause the gas mixture 120 to fail to produce pulses of light that are within specification. For example, a sealed chamber (a gas discharge chamber) that holds or contains the gas mixture 120 can reach the end of its life. Or, one or more modules within the optical system

105 can reach the end of their life. Or, one or more modules within the optical system 105 can become misaligned.

The assumed gas lifetime is a conservative estimate of the actual gas lifetime based on knowledge of performance of optical systems that are similar to the optical system 105. The assumed gas lifetime can be a predetermined constant value, and the assumed gas lifetime is such that it is very unlikely that the gas mixture in any optical system has an actual lifetime that is less than the assumed lifetime. However, individual optical systems and gas mixtures experience different conditions during operational use. As such, the actual gas lifetime for a particular gas mixture (such as the gas mixture 120) can be different from the actual gas lifetime for another gas mixture. Moreover, because the assumed gas lifetime is a conservative estimate, it is likely that the actual gas lifetime for a particular gas mixture used under ordinary operating conditions is greater than the assumed gas lifetime.

In a typical optical system, the gas mixture 120 is replaced when the assumed lifetime is reached using a procedure called a refill procedure. A refill procedure includes removing and replacing the gas mixture 120. And, a refill procedure often consumes (wastes) materials of the gas mixture 120. Moreover, the optical system 105 cannot be operated during the refill procedure. For at least these reasons, it is desirable to reduce the number of refill procedures that are performed on the optical system 105. Moreover, it is desirable to only perform a refill procedure when such a refill procedure would improve operation of the optical system 105. During a refill, the contents of the gas mixture 120 are returned to a desired mix, concentration, and pressure. For example, the new gas is introduced in an amount that is sufficient to arrive at a particular pressure and concentration of certain components of the gas mixture 120. After the refill, the operation of the optical system 105 ideally should be improved relative to its operation prior to the refill.

Figure 2A:
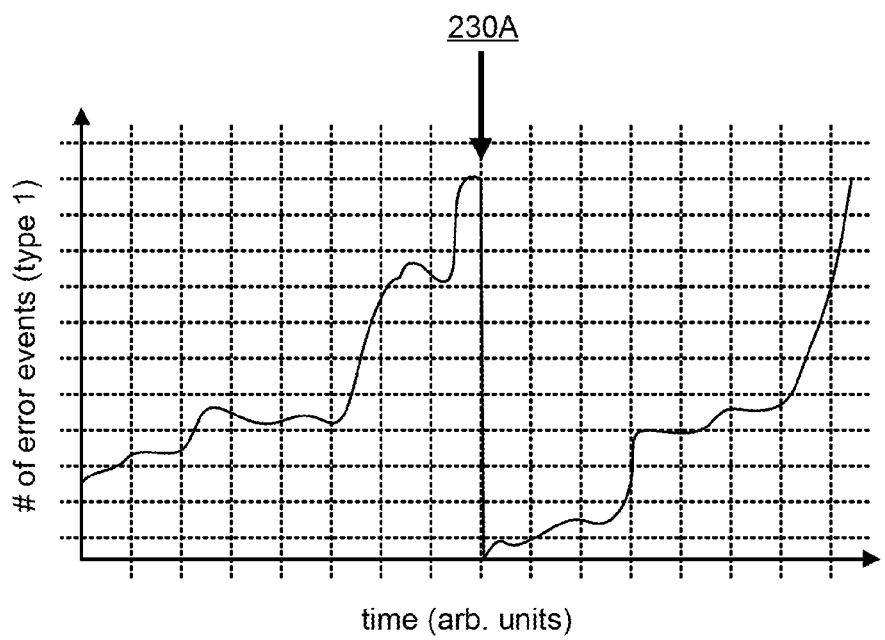
FIG. 2A is a graph of a total number of error events for a set of a first type of performance conditions versus time, in which a refill procedure has little impact on the error events for the set of the first type of performance conditions.

For example, with reference to FIG. 2A, the effect of a refill procedure 230A on a hypothetical gas mixture is discussed. In this example, a graph of the total number of error events for a set of a first type of performance conditions [pci1] versus time. The total number of error events for the set of the first type of performance conditions is shown both before the refill procedure 230A and after the refill procedure 230A (in which a new gas mixture is being used in the optical system 105). This comparison demonstrates that the number of error events for the set of the first type of performance conditions is not reduced by the refill procedure 230A. FIG. 2A thus illustrates a situation in which a refill was not successful in preventing or reducing the observed error events.

Figure 2B:
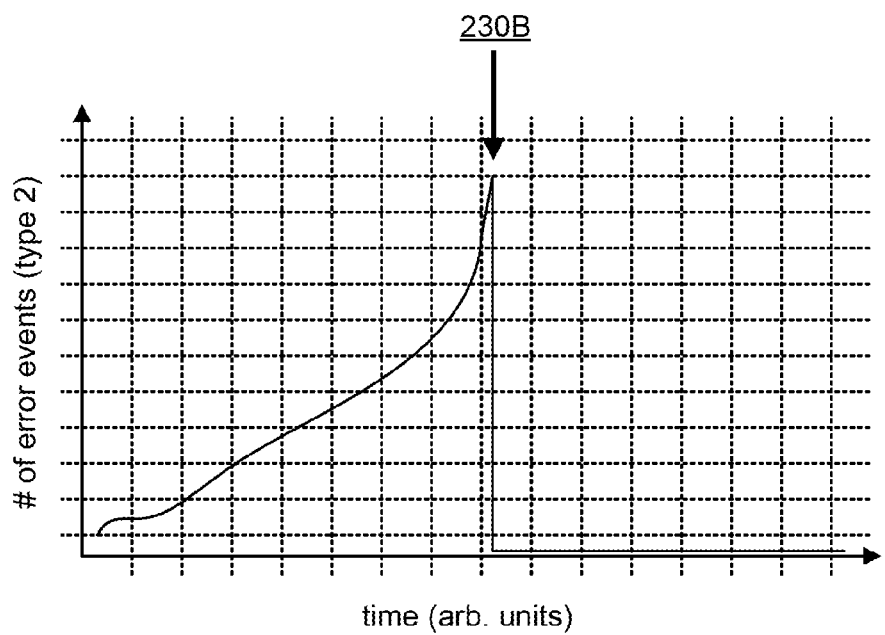
FIG. 2B is a graph of a total number of error events for a set of a second type of performance conditions versus time, in which a refill procedure has a greater impact on the error events for the set of the second type of performance conditions.

By contrast, with reference to FIG. 2B, the effect of a refill procedure 230B on a hypothetical gas mixture is discussed. FIG. 2B shows a graph of the total number of error events for a set of a second type of performance conditions [pci2] versus time. The total number of error events for the set of the second type of performance conditions is shown both before the refill procedure 230B and after the refill procedure 230B (in which a new gas mixture is being used in the optical system 105). This comparison demonstrates that the number of error events for the set of the second type of performance conditions is reduced by the refill procedure 230B. FIG. 2B thus illustrates a situation in which a refill was successful in preventing or reducing the observed error events. It can be considered that the set of the second type of performance conditions are more relevant to health or operation of the gas mixture 120 than other set of the first type of performance conditions. In particular, and in general, rates of error events in the performance conditions that are more relevant to the health or operation of the gas mixture 120 are reduced by the operation of the refill procedure 230.

However, it is not well understood which performance conditions would be affected by a particular refill procedure, especially if various combinations of many performance conditions are considered in the determination. This analysis is complex at least in part because a large amount of information relating to performance conditions needs to be analyzed. For example, the monitoring apparatus 100 can receive information relating to many different types of performance conditions. In some implementations, greater than 30 types of performance conditions (or error rates of performance conditions) are monitored and analyzed by the monitoring apparatus 100. Because of this, the monitoring apparatus 100 uses a data-driven machine learning approach (via the predetermined learning model 125) to avoid performing unnecessary refills in a futile attempt to eliminate or reduce performance condition error rates that are unrelated to the health or operation of the gas mixture 120. The monitoring apparatus 100 identifies, with the help of the predetermined learning model 125, which combinations and rates of errors in performance conditions would be remedied by the refill procedure (that is, can be expected to be remedied by the refill procedure). The monitoring apparatus 100 can additionally identify, with the help of the predetermined learning model 125, which combinations and rates of error events would be remedied by another change to an aspect of the optical system 105 that does not include a refill procedure (that is, can be expected to be remedied by the other change).

Performance conditions include any information related to (or that can be used to determine) whether a property of the pulsed light beam 110 meets the specification. Each performance condition can be binary numerical data that has only two possible values, with one of the values indicating that the property of the pulsed light beam 110 meets the specification and the other of the values indicating that the property of the pulsed light beam 110 does not meet specifications. In some implementations, the performance condition is numerical data that is not binary. For example, the performance condition can be a measured value detected or sensed by a device that is a part of a metrology module (such as metrology module 360 of FIG. 3). In yet another example, each performance condition can be a numerical value that represents a difference between a measured value and an expected or ideal value.

Performance conditions can be related to operating parameters or characteristics of the light beam 110. As an example, performance conditions can include energy, wavelength, pulse duration, repetition rate, and bandwidth of the light beam 110. Performance conditions can include error events associated with any operating parameter or characteristic of the light beam 110 or the optical system 105. For example, an error event is an event in which an operating parameter or characteristic of the light beam 110 or the optical system 105 exceeds a threshold, and when this happens, the error event (including data associated with a window of time around the error event) is recorded and/or stored within memory.

Figures 11A, 11B:
FIG. 11A is a table of an example of likelihood scores output from a set of fault signature algorithms applied to each error event, each error event corresponding to a performance condition of the optical system.
FIG. 11B is a table showing how the output scores of FIG. 11A for each of the fault signature algorithms is used.

In some implementations, the error event can be analyzed relative to a set (a plurality) of fault signature algorithms. Each fault signature algorithm is designed to represent a specific failure mode or failure signature. Each fault signature algorithm outputs a score in an attempt to classify the error event into known failure modes or failure signatures. As an example, the algorithm for a particular failure signature can output a likelihood score that the particular failure signature is present in the error event. FIG. 11A shows an example of an output of the set of fault signature algorithms for each error event (BQi, where i ranges from 1 to N), and FIG. 11B shows how the scores output from each of the fault signature algorithms is used, as discussed in greater detail below.

In some implementations, as discussed below, performance conditions are related to changes in a configuration of the optical system 105. For example, performance conditions can include one or more of a change in a concentration of components within the gas mixture 120, a change in temperature of the gas mixture 120, a change in voltage applied to an energy source that supplies energy to the gas mixture 120, and a change in conditions relating to how new components are added to the gas mixture 120.

Performance conditions can be related to operating parameters or characteristics of the components within the optical system 105. For example, performance conditions can include a number of pulses output from the gas mixture 120, a number of pulses of the light beam 110 output from the optical system 105, and efficiencies or efficiency anomalies associated with components such as optical oscillators or optical amplifiers within the optical system 105. Performance conditions can include fault signatures or a state of operation of the optical system 105.

The performance conditions include one or more of: types of beam quality errors in the light beam 110, number of occurrences of a discharge event in the gas mixture 120 over a period of time, one or more faults associated with the errors in beam quality of the light beam 110, the beam quality of the light beam 110, and errors in the beam quality of the light beam 110.

In one example, a performance condition can include "MO Dropout," which is a single-pulse "dropout" of energy output in a gas discharge chamber (which holds/contains the gas mixture 120) of a master oscillator (MO) of the optical system 105. For example, if the MO is firing pulses at 1 milleJoule (mJ), and the energy of a light beam emitted from the MO drops to 0.1 mJ for a single pulse, and then returns to 1 mJ, this might indicate an MO Dropout event. Typically, the MO dropout is believed to be related to the age of the gas discharge chamber, and not gas health. In another example, a performance condition can include a "MO Rollover," which refers to the MO moving into a region of operation in which an increase in voltage results in a loss of energy. In short, this can be thought of as a chronic efficiency loss of the MO gas discharge chamber. Typically, the MO Rollover condition is believed to be improved by a refill.

Referring again to FIG. 1, the monitoring apparatus 100 includes a decision module 127 that is configured to receive a performance metric 107. The performance metric 107 relates to the performance conditions of the optical system 105. That is, the performance metric 107 includes information about one or more performance conditions of the optical system 105. The performance metric 107 can be a linear array of values of the performance conditions of the optical system 105. Or, the performance metric 107 can be a number or value that is determined or calculated from the values of the performance conditions of the optical system 105.

Each performance condition provides an indication related to the health or operation of the optical system 105. As discussed above, not all performance conditions are related to the health or operation of the optical system 105 or the gas mixture 120. Moreover, it is possible for some combinations of performance conditions to be more indicative of the health or operation of the gas mixture 120 than other combinations of performance conditions. It is also possible that some combinations of performance conditions change their impact on the health or operation of the optical system 105 with the progression of time. For example, some performance conditions might have a greater impact on the health or operation of the optical system 105 after the optical system 105 has been used for a particular period of time than they would earlier in the life of the optical system 105. The information in the performance metric 107 related to the performance conditions of the optical system 105 can include information relating to errors or rates of errors in the performance conditions, or faults associated with performance conditions. Thus, in some situations, if error rates for a particular combination of performance conditions are elevated, then the monitoring apparatus 100 may determine that a refill procedure 230 is needed.

The decision module 127 is configured to estimate, based on the received performance metric 107 and the predetermined learning model 125, the effectiveness 129 of a proposed change to the optical system 105. The proposed change can be a proposed refill of the gas mixture 120 of the optical system 105, or a proposed change in a configuration of the optical system 105. The decision module 127 is also configured to output a command 109 to the optical system 105, the command 109 depending on or being directly related to the estimate of the effectiveness 129. For example, the command 109 can be a refill command indicating to the optical system 105 to refill the gas mixture 120 if it is estimated that the proposed refill of the gas mixture 120 of the optical system 105 would be effective 129.

In particular, the predetermined learning model 125 receives the performance metric 107 as its input and outputs the estimate of the effectiveness 129 for use by the decision module 127. The performance metric 107 includes the information about the performance conditions that exist before the proposed change (such as the proposed gas refill). The estimate of the effectiveness 129 is a prediction regarding whether the proposed (and as yet to occur) change will cause a significant reduction in error rates of performance conditions of the optical system 105.

In some implementations, the decision module 127 outputs a maintain command (as the command 109) to the optical system 105 to, for example, extend use of the gas mixture 120 if the decision module 127 estimates that the proposed refill of the gas mixture 120 of the optical system 105 would not be effective 129. In other implementations, the decision module 127 delays sending a command 109 to the optical system 105 in the situation in which the decision module 127 estimates that the proposed refill of the gas mixture 120 of the optical system 105 would not be effective 129; by delaying the command 109, the optical system 105 maintains its current status.

In still other implementations, instead of outputting a command, the decision module 127 outputs a proposal to another controller or even to a field service engineer, and the controller/field service engineer can make the decision relating to whether the proposed refill should be performed.

The decision module 127 can include or have access to one or more programmable processors and can each execute a program of instructions to perform desired functions by operating on input data and generating appropriate output. The decision module 127 can be implemented in any of digital electronic circuitry, computer hardware, firmware, or software. In further implementations, the decision module 127 accesses memory, which is configured to store information output from the decision module 127, information from the optical system 105, or even the performance matric 107, such information being available for various use by the decision module 127 during operation of the apparatus 100. The memory can be read-only memory and/or random-access memory and can provide a storage device suitable for tangibly embodying computer program instructions and data. The monitoring apparatus 100 can also include one or more input devices (such as a keyboard, touch-enabled devices, audio input devices) and one or more output devices such as audio output or video output.

Figure 3:
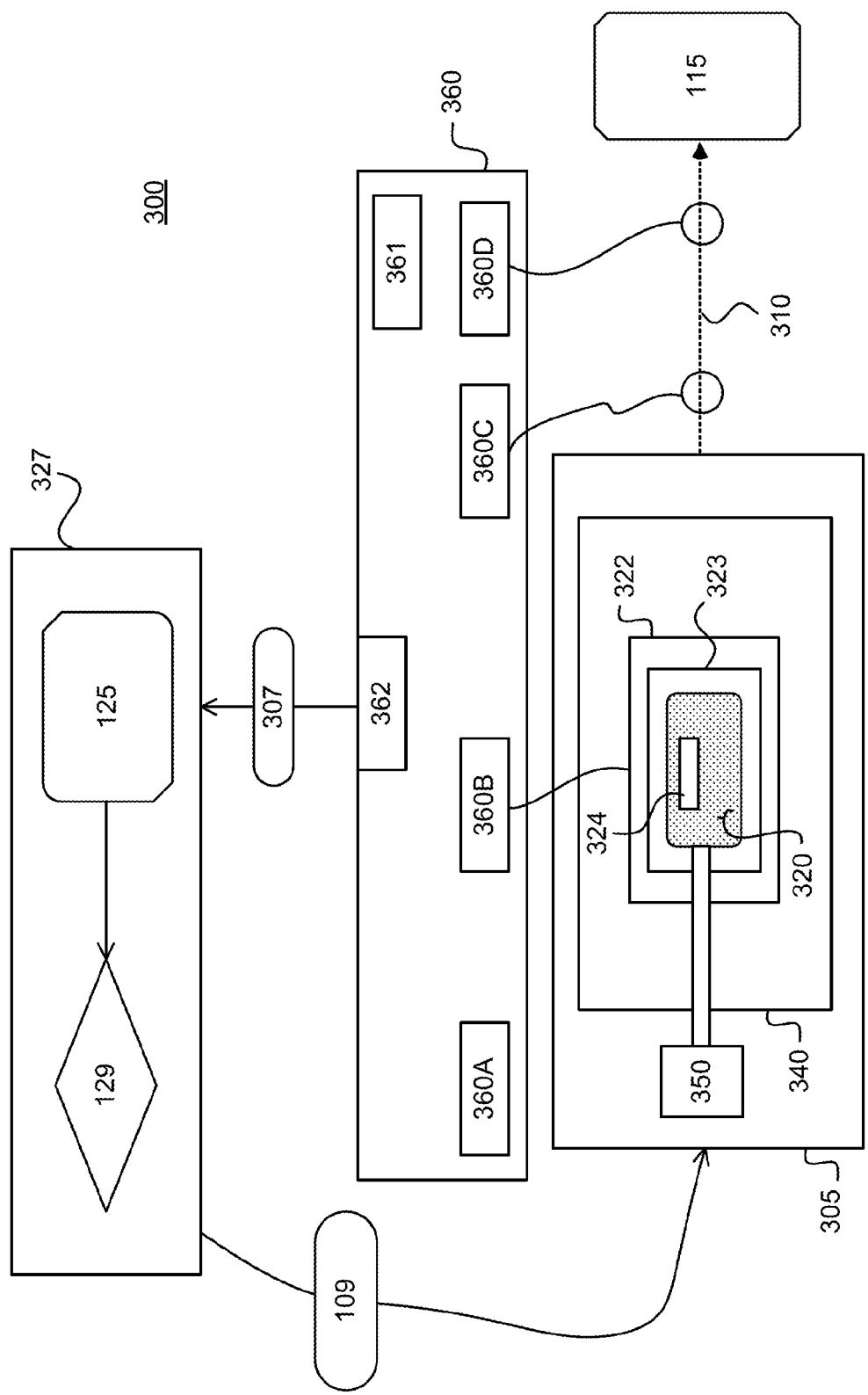
FIG. 3 is a block diagram of an implementation of an optical system and an implementation of an interface module in communication with the predictive apparatus of FIG. 1 and configured to obtain and analyze data from the optical system.

The gas mixture 120 produces the light beam 110 from a population inversion occurring in the gain medium of the gas mixture 120 by way of stimulated emission when energy is provided to the gas mixture 120 (for example, by way of an energy source 324, as shown in FIG. 3). The concentration state of the gas mixture 120 provides an indication of relative amounts of chemical components within the gas mixture 120. For example, the gas mixture 120 can include a mixture of a gain medium and a buffer gas, where the gain medium is a laser-active entity within the gas mixture 120 that can be either a single atom, a molecule, or a pseudo-molecule. The population inversion occurs in the gain medium. The gain medium can include a noble gas and a halogen, while the buffer gas can include an inert gas. Nobel gases that can be used include, for example, argon, krypton, or xenon. The halogen gas can be, for example, fluorine. The inert gas can include, for example, helium or neon. As an example, the gas mixture 120 can include argon fluoride (ArF), which produces a light beam 110 at a wavelength of about 193 nanometers (nm). As another example, the gas mixture 120 can include krypton fluoride (KrF), which produces a light beam 110 at a wavelength of about 248 nm.

The predetermined learning model 125 can be any structure that enables assembling a dataset, assembling an input vector with fault signature detection (FSD), training the dataset, testing the dataset, and then applying the learning model. For example, in some implementations, the learning model includes a neural network, a decision tree, or a K-nearest neighbor model.

In some implementations that will be discussed in detail herein, the predetermined learning model 125 is a support vector machine. The support vector machine categorizes each input (the performance metric 107) into one of two classes related to the effectiveness 129. In this example, a first class is positive, which means that a proposed change (such as a proposed gas refill) would be effective and improve performance conditions of the optical system 105; and a second class is neutral or not positive, which means that the proposed change (such as a proposed gas refill) would not be effective and therefore would not improve performance conditions of the optical system 105.

The support vector machine can utilize a separating hyperplane, the hyperplane classifying the input data (that is, the performance metric 107) as either the first class or the second class, such hyperplane being able to analyze a multidimensional performance metric 107. The support vector machine also defines boundaries and constraints relating to the analysis of the input data so as to separate the data in an efficient manner and thereby output the classification.

The predetermined learning model 125 can be built based on a type, a configuration, a change in configuration, and/or an age of the optical system 105, as will be discussed below.

Referring to FIG. 3, in some implementations, the monitoring apparatus 100 can be implemented as a monitoring apparatus 300 and the optical system 105 can be designed as an optical system 305 producing a light beam 310. The optical system 305 includes an optical source 340 that produces the light beam 310 from the gas mixture 320, and a gas supply system 350 that is in fluid communication with the gas mixture 320.

While not shown in FIG. 3, the optical source 340 can include other gas mixtures and other optical components that are used in combination with the gas mixture 320 to produce the light beam 310. These other gas mixtures can be in fluid but separate communication with the gas supply system 350.

The gas mixture 320 is a part of a gas subsystem 322 within the optical source 340. The gas subsystem 322 can include other components, such as vessel 323 that forms a sealed chamber (a gas discharge chamber) that holds the gas mixture 320 and an energy source 324 to excite the gain medium within the gas mixture 320. The energy source 324 can include a cathode and an anode and the gas discharge chamber 323 can enclose the cathode and the anode 214b as well as the gas mixture 320. A potential difference between the cathode and the anode forms an electric field in the gas mixture 320. The electric field provides energy to the gain medium within the gas mixture 320, such energy sufficient to cause a population inversion and to enable generation of a pulse of light via stimulated emission. Repeated creation of such a potential difference forms the train of pulses of light that eventually make up the light beam 310. A "discharge event" is the application of voltage that forms a potential difference sufficient to cause an electrical discharge in the gain medium of the gas mixture 320 and the emission of a pulse of light.

Figure 5:
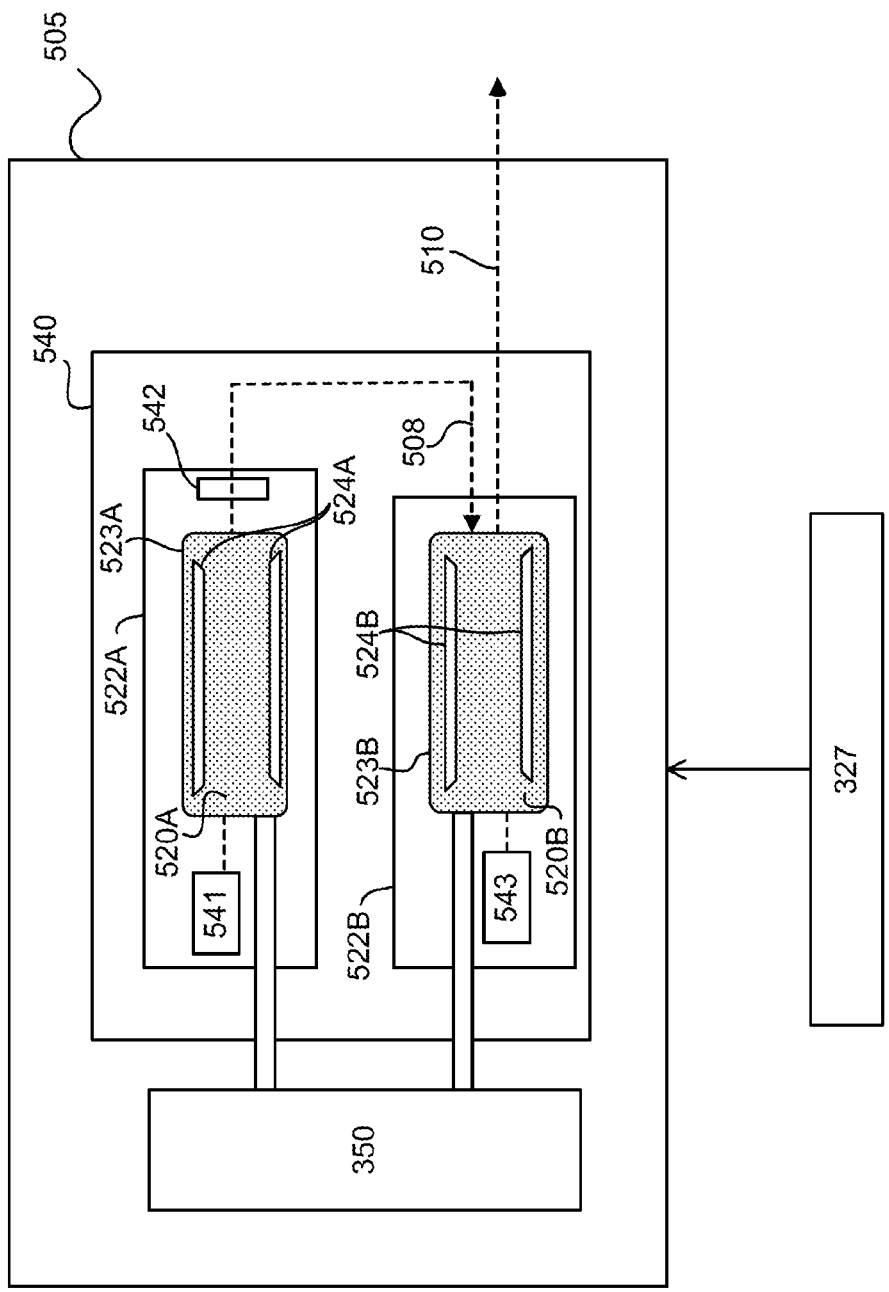
FIG. 5 is a block diagram of an implementation of an optical system including a dual-stage optical source.

FIG. 5 shows an implementation of a gas subsystem 322 and an optical source 340 including two chambers, each chamber holding or retaining its own gas mixture.

Figure 4:
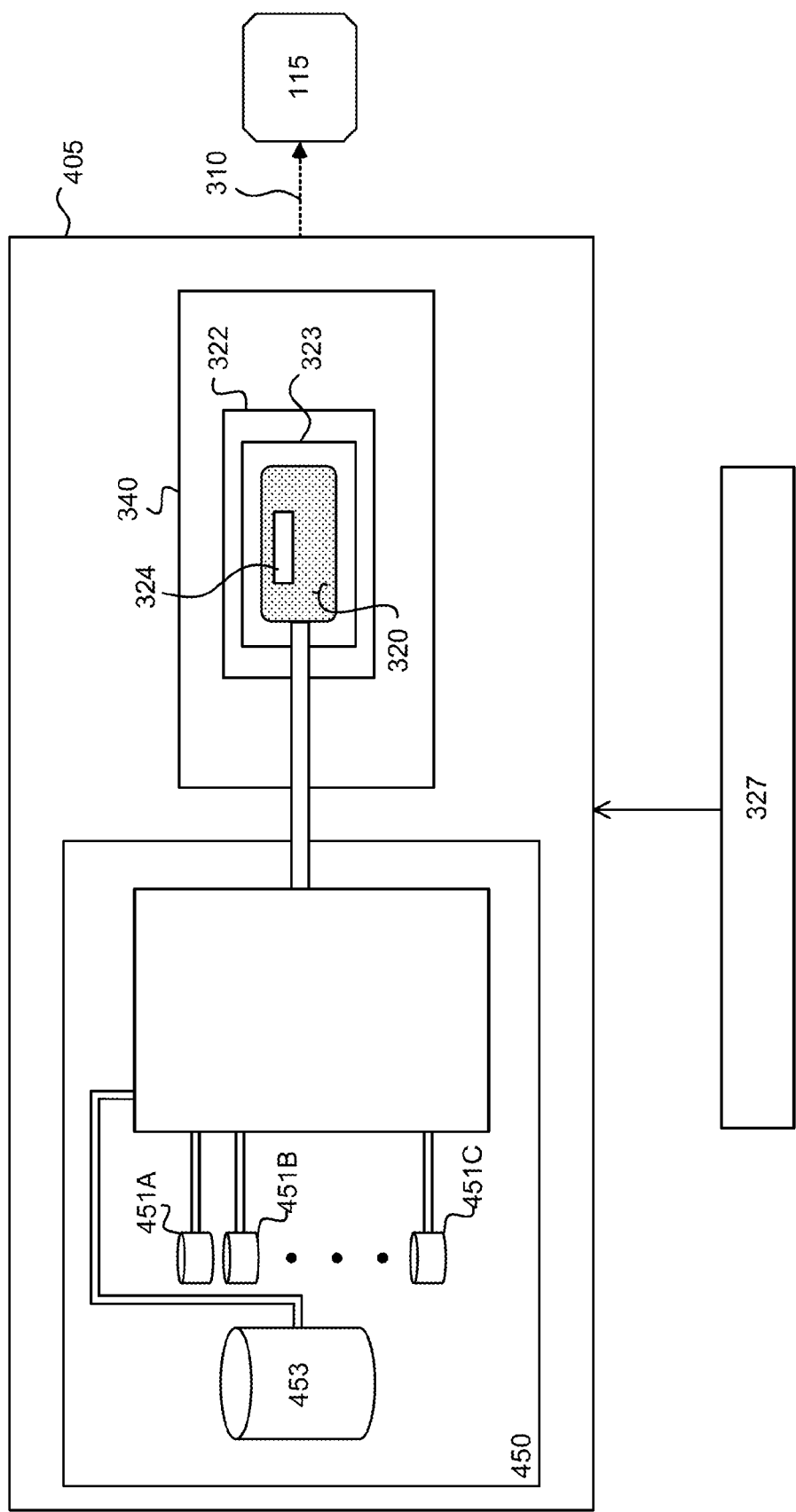
FIG. 4 is a block diagram of an implementation of an optical system including a gas supply system in communication with the predictive apparatus of FIG. 1 or 3.

The gas supply system 350 includes one or more sources of gas, fluid conduits configured to supply the gas to the chamber of the gas subsystem 322, and a valve system that includes one or more fluid control valves between the gas sources and the chamber. FIG. 4 shows an implementation 450 of a gas supply system 350.

The monitoring system 300 includes a decision module 327 that, like the decision module 127, receives a performance metric 307 that relates to the performance conditions of the optical system 305. That is, the performance metric 307 includes information about one or more performance conditions of the optical system 305.

Additionally, the monitoring system 300 also includes an interface module 360 in communication with the decision module 327. The interface module 360 is configured to obtain and analyze data from the optical system 305 and the light beam 310, calculate and build the performance metric 307, and then provide the performance metric 307.

The interface module 360 includes a plurality of analysis sub-modules 360$i$, memory 361 that receives and stores information from one or more of the analyses sub-modules 360$i$, and an output sub-module 362 that accesses outputs from one or more of the analyses sub-modules 360$i$ and the memory 361 and builds the performance metric 307. In the example shown, the analysis sub-modules 360$i$ include four analysis sub-modules 360A, 360B, 360C, and 360D. Each analysis sub-module 360$i$ is configured to interact with a dedicated aspect of the optical system 305, and this includes the possibility of interacting with the light beam 310. Each analysis sub-module 360$i$ includes hardware that senses, detects, or receives data or information relating to the aspect of the optical system 305 to which it is dedicated. The interface module 360 prepares the performance conditions of the optical system 305 from this data or information, and builds the performance metric 307 from the performance conditions for use by the decision module 327. The interface module 360 can include or have access to one or more programmable processors and can each execute a program of instructions to perform desired functions by operating on input data and generating appropriate output. The interface module 360 can be implemented in any of digital electronic circuitry, computer hardware, firmware, or software.

In this implementation, at least two of the analysis sub-modules 360i are beam quality detection sub-module 360C and 360D. For example, the beam quality detection sub-module 360C can be a spectral feature detection sub-module configured to detect an error in a spectral feature of the light beam 310 and to produce a signal that indicates the respective spectral feature error of the light beam 310. The spectral feature of the light beam 310 can be any feature of the optical spectrum (or emission spectrum) of the light beam 310. The optical spectrum containing information on how the optical energy or power is distributed as a function of wavelength or optical frequency of the light beam 310. Thus, for example, the spectral feature of the light beam 310 can be a wavelength at a particular optical energy or power or a width of the optical spectrum (referred to as a bandwidth). As another example, the beam quality detection sub-module 360D can be an energy detection sub-module configured to detect an error in an energy of the light beam 310 and to produce a signal that indicates the energy error of the light beam 310.

The beam quality detection sub-modules 360C and 360D can include respective sensors that can be positioned at any location where the light beam 310 can be sensed. For example, the sensor can be in the optical system 305, between the optical system 305 and the output apparatus 115, or in the output apparatus 115.

The output of each of the sub-modules 360C and 360D can be the actual measured data from a sensor or it can be an average of the data received from the sensor over a specific period of time. For example, if the beam quality detection sub-module 360D is an energy detection sub-module, then it can include an energy sensor that is used to estimate the dose, and the output can have two values, one indicating that the dose is in specification and the other indicating that the dose is not in specification. The dose is an amount of optical energy delivered to an area of the wafer. To determine the dose, the energy sensor measures the amount of energy over a period of time and also counts the number of pulses of the light beam 310 emitted over that period of time. In these implementations, the energy sensor can include a detector that measures energy and a beam splitter that is in the path of the light beam 310. The beam splitter directs a portion of the light in each pulse to the detector. The detector measures the amount of energy over a time period. Furthermore, the number of pulses that occur over the time period can be derived from the energy measured by the detector. For example, if the detected energy is greater than a threshold value, then a pulse is deemed to be present. If the detected energy is lower than the threshold, then a pulse is not present. Thus, the data from the energy sensor can be used to determine a beam quality metric based on dose.

The output from the analysis sub-modules 360C, 360D can include error events associated with any operating parameter or characteristic of the light beam 310 or the optical system 305. As discussed above, the error event is an event in which the operating parameter or characteristic of the light beam 310 or the optical system 305 exceeds a threshold. When this happens, the error event (including data associated with a window of time around the error event) is recorded and/or stored within memory 361 for access by the output module 362.

At least one of the analysis sub-modules 360i is a discharge count detection sub-module 360B configured to detect an occurrence of a discharge event in the gas mixture 320, and to produce a signal that indicates a count of discharge events over a period of time. The period of time can be measured since the last time the gas mixture 320 was refilled or can be measured since a replacement of one or more chambers containing the gas mixture 320 within the optical system 305.

At least one of the analysis sub-modules 360i is a fault signature sub-module 360A configured to analyze each error event relative to a set of fault signatures and to produce a likelihood score that classifies the error event into known fault signatures. The algorithm for a particular failure signature can output a likelihood score that the particular failure signature is present in the error event. FIG. 11A shows an example of an output of the set of fault signature algorithms for each error event (BQi, where i ranges from 1 to N), and FIG. 11B shows how the scores output from each of the fault signature algorithms is used, as discussed in greater detail below.

Referring to FIG. 4, an implementation of the gas supply system 450 is shown. The gas supply system 450 includes one or more sources of a gas 451A, 451B, 451C; conduits for supplying the gas to the chamber 323 in the gas subsystem 322; and a valve system 452 that includes one or more fluid control valves between the gas sources 451A, 451B, 451C and the chamber in the gas subsystem 322. The sources of gas 451A, 451B, 451C can supply the gas to multiple chambers, for example, such as when the optical source 340 includes multiple stages each including a gas discharge chamber with a gas mixture, as discussed with reference to FIG. 5. The gas sources 451A, 451B, 451C can be, for example, sealed gas bottles and/or canisters. The gas mixture 320, as an example, can contain a halogen such as fluorine, along with other gases including argon, neon, and possibly others in different partial pressures that sum to a total pressure P. Further, one or more gas sources 451A, 451B, 451C are connected to the chamber 323 through a set of fluid control valves within the valve system 452. With this design, gas can be injected into the chamber 323 with specific relative amounts of components of the gas mixture 320. For example, if the gain medium in the gas mixture 320 is argon fluoride (ArF), then one of the gas sources 451A can contain a mixture of gases including the halogen fluorine, the noble gas argon, and one or more other rare gases such as buffer gases including inert gases like neon. The described mixture can be referred to as a tri-mix. In this example, the gas source 451B can contain a mixture of gases including argon and one or more other gases except any of fluorine. The described mixture can be referred to as a bi-mix. Although only three gas sources are shown 451A, 451B, 451C, the gas supply system 450 can have fewer than three or greater than three gas sources.

The decision module 327 can communicate with the valve system 452 using one or more signals to cause the valve system 452 to transfer gases from specific gas sources 451A, 451B, 451C into the chamber 323 in a gas refill. In addition to, or alternatively, the decision module 327 can communicate with the valve system 452 using one or more signals to cause the valve system 452 to initially bleed all of the gas from the chamber 323 before a refill, and such bled gas can be vented to a gas dump 490.

Although it is not shown, the fluid control valves of the valve system 452 can include a plurality of valves assigned to each chamber of the gas subsystem 322 or each chamber of the optical source 340. For example, the valve system 452 can include an injection valve that allows gas to pass into and out of the chamber at a first rate, and a chamber fill valve that allows gas to pass into and out of the chamber at a second rate that is different from the first rate.

Referring to FIG. 5, an implementation 505 of the optical system 305 is shown. The optical system 505 is a dual-chamber optical system 505 including an optical source 540 that has a first gas subsystem 522A and a second gas subsystem 522B in optical communication with the first gas subsystem 522A. The first gas subsystem 522A is a master oscillator system, and the second gas subsystem 522B is a power amplifier system. The master oscillator system 522A includes a master oscillator gas discharge chamber 523A and the power amplifier system 522B includes a power amplifier gas discharge chamber 523B. The master oscillator gas discharge chamber 523A includes as the energy source 524A two elongated electrodes that provide a source of pulsed energy to the gas mixture 520A within the chamber 523A. The power amplifier gas discharge chamber 523B includes as the energy source 524B two elongated electrodes that provide a source of pulsed energy to the gas mixture 520B within the chamber 523B.

The master oscillator system 522A provides a pulsed amplified light beam (called a seed light beam) 508 to the power amplifier system 522B. The master oscillator gas discharge chamber 523A houses the gas mixture 520A that includes a gain medium in which amplification occurs and the master oscillator system 522A includes an optical feedback mechanism such as an optical resonator. The optical resonator is formed between a spectral optical system 541 on one side of the master oscillator gas discharge chamber 523A and an output coupler 542 on a second side of the master oscillator gas discharge chamber 523A. The power amplifier gas discharge chamber 523B houses the gas mixture 520B that includes a gain medium in which amplification occurs when seeded with the seed light beam 508 from the master oscillator system 522A. If the power amplifier system 522B is designed as a regenerative ring resonator then it is described as a power ring amplifier, and in this case, enough optical feedback can be provided from the ring design. The power amplifier system 522B can also include a beam return (such as a reflector) 543 that returns (via reflection, for example) the light beam back into the power amplifier gas discharge chamber 523B to form a circulating and looped path (in which the input into the ring amplifier intersects the output out of the ring amplifier). For example, the master oscillator system 522A can emit a pulsed seed light beam 508 having seed pulse energies of approximately 1 milliJoule (mJ) per pulse, and these seed pulses can be amplified by the power amplifier system 522B to about 10 to 15 mJ.

The gas mixture (for example, gas mixture 520A, 520B) used in the respective discharge chamber 523A, 523B can be a combination of suitable gases for producing the amplified light beam around the required wavelengths, bandwidth, and energy. For example, as discussed above, the gas mixture 520A, 520B can include argon fluoride (ArF), which emits light at a wavelength of about 193 nm, or krypton fluoride (KrF), which emits light at a wavelength of about 248 nm.

Figure 6:
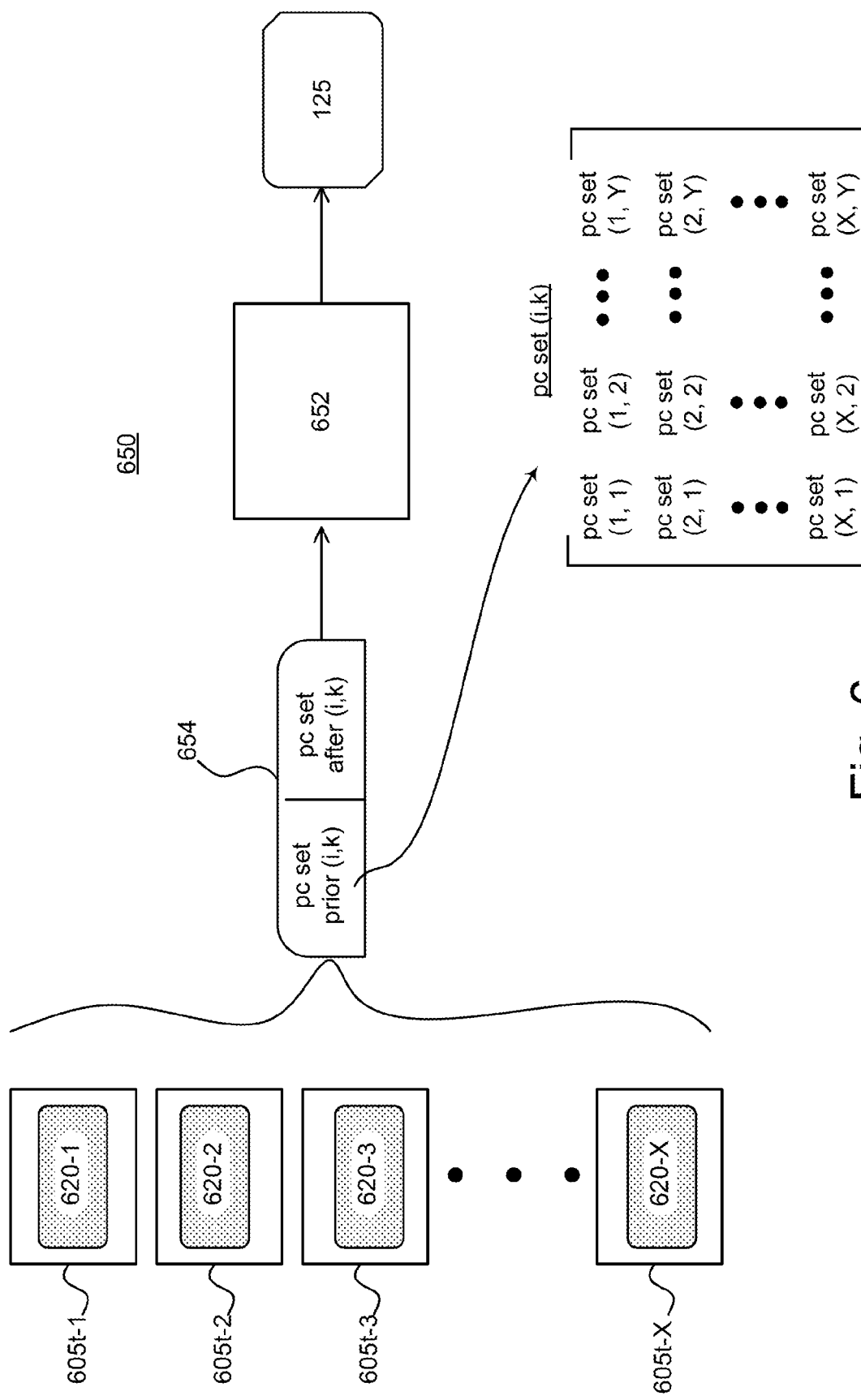
FIG. 6 is a block diagram of a training apparatus configured to build a learning model for use in a decision module of the predictive apparatus of FIG. 1 or 3.

Referring to FIG. 6, a training apparatus 650 builds the learning model 125. The training apparatus 650 includes a training module 652 that is configured to receive a training dataset 654 and to generate, based on the training dataset 654, the learning model 125. The training module 652 can include or have access to one or more programmable processors and can each execute a program of instructions to perform desired functions by operating on input data and generating appropriate output. The training module 652 can be implemented in any of digital electronic circuitry, computer hardware, firmware, or software. In further implementations, the training module 652 accesses memory, which is configured to store information output from the training module 652, information used to generate the training dataset 654, or the training dataset 654. The memory can be read-only memory and/or random-access memory and can provide a storage device suitable for tangibly embodying computer program instructions and data. The training module 652 can also include one or more input devices (such as a keyboard, touch-enabled devices, audio input devices) and one or more output devices such as audio output or video output.

The training dataset 654 is formed from a plurality of test optical systems 605$t$-$i$ (where i=1, 2, 3, . . . X) and is based on one or more system changes k performed on each of the test optical systems 605$t$-$i$. The test optical systems 605$t$-$i$ can include or can be distinct from the optical system 105 that will be analyzed by the decision module 127, 327. Each system change k can be a refill of a gas mixture 620-$i$ within the test optical system 605$t$-$i$ or a change in a configuration of the test optical system 605$t$-$i$.

The training dataset 654 includes two multidimensional matrices, each called pc set (i, k). The first matrix [pc set prior (i, k)] includes a plurality of values of performance conditions relating to each test optical system 605$t$-$i$ and each system change k taken prior to the system change of that test optical system 605$t$-$i$. The second matrix [pc set after (i, k)] includes a plurality of values of the same performance conditions relating to each test optical system 605$t$-$i$ and each system change k taken after the system change of that test optical system 605$t$-$i$. The value i in the set corresponds to the test optical system 605$t$-$i$ in which the system change is performed (i ranges from 1 to X) and the value k corresponds to the particular system change performed for the i-th test optical systems 605$t$-$i$ (k ranges from 1 to Y). The total number Y of system changes k for each test optical systems 605$t$-$i$ can vary. That is, there may be more system changes performed on some test optical systems 605$t$-$i$ than others.

Each plurality of values of performance conditions, pc set, includes a plurality of performance conditions and the total number of distinct performance conditions in the plurality can be any number, and only depends on how many performance conditions are monitored or tracked by the interface module 360. For example, in some situations, there could be tens of performance conditions in the plurality of values pc set.

Thus, the training dataset 654 includes several sets of values of the performance conditions for each test optical systems 605$t$-$i$ because several gas refills are performed for each of the test optical systems 605$t$-$i$. For example, the training dataset 654 can include the plurality of values of performance conditions for hundreds or thousands of gas refills, which can be associated with tens or hundreds of distinct test optical systems 605$t$-$i$. Additionally, the training dataset 654 can include the plurality of values of performance conditions for tens or hundreds or thousands of changes to configurations of the test optical systems 605$t$-$i$.

Because the learning model 125 is built from so many different system changes k (including gas refills and changes to configurations) and so many distinct test optical systems 605$t$-$i$, the learning model 125 can be modular. This means that the learning model 125 can be used on any other optical system 105 having a design similar to the test optical systems 605*t-i* used to produce the training dataset 654 input to the training module 652.

The learning model 125 is a prediction model 125. In some implementations, the learning model 125 includes a support vector machine that, as discussed above when used by the decision module 127 (FIG. 1), categorizes each input (the performance metric 107) into one of two classes related to the effectiveness 129. The estimate of the effectiveness 129 of a proposed system change (such as a gas refill) indicates whether performance conditions of the optical system 105 would improve due to the proposed system change. A first class is positive, which means that a proposed system change would be effective and improve performance conditions of the optical system 105; and a second class is neutral or not positive, which means that the proposed system change would not be effective and therefore would not improve performance conditions of the optical system 105.

The learning model 125 initially produces an analog output, which indicates which side of the hyperplane an observation (the performance metric 107) lies on, and how far away it is from the hyperplane. The analog output ranges in values between +1 and −1 and a threshold value, which, in simplified form, can be 0.

The learning model 125 determines the binary output (positive or neutral class) based on analog data. Thus, the learning model 125 can assign any positive values to a first positive class (+1) and any negative values to a second neutral class (−1). The learning model 125 assigns any values that are closer to 0 with somewhat less confidence. So, for example, given an input vector K (the performance metric 107), an analog output that is positive and having a small magnitude (for example, +0.2) indicates that the input vector k lies on the "positive" side of the hyperplane but is proximate to the hyperplane and thus is subject to some uncertainty when categorized as a positive class. On the other hand, an analog output that is negative and has a large magnitude (for example, −0.9) indicates that the input vector k lies on the "negative" side of the hyperplane but is relatively far away from the hyperplane and thus more likely to be correctly categorized as a neutral class.

Figure 7:
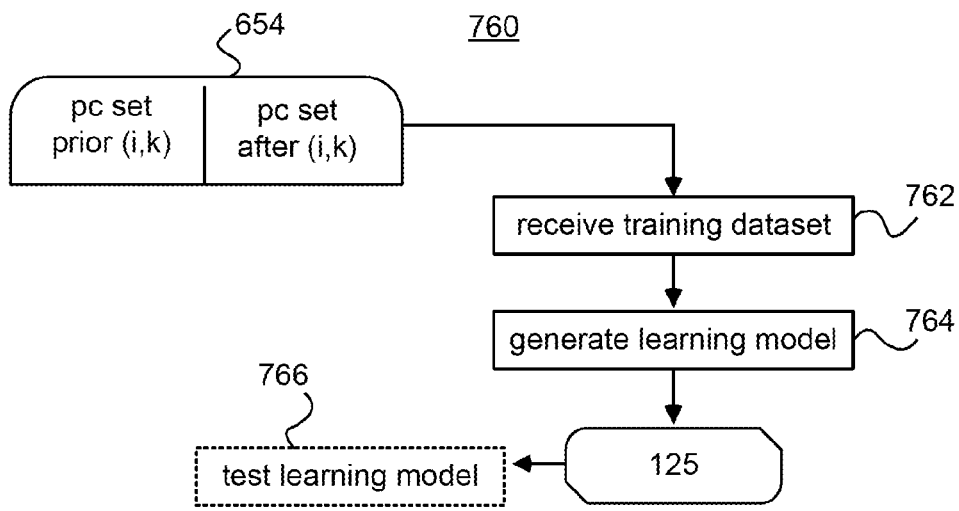
FIG. 7 is a flow chart of an implementation of a procedure for building the learning model that can be performed by the training apparatus of FIG. 6.

Referring to FIG. 7, the learning model 125 is trained according to a procedure 760. The training module 652 performs the procedure 760. Initially, the training module 652 receives the training dataset 654 (762). Next, the training module 652 generates the learning model 125 based on the training dataset 654 (764). In some implementations, the generated learning model 125 is validated (766) using a test dataset, as discussed below. The generated learning model 125 is output for use by the decision module 127.

The training module 652 can generate the learning model 125 (764) by comparing, for each system change k and each test optical system 605*t-i*, the plurality of values of performance conditions pc set (i, k) measured after the system change to the plurality of values of performance conditions pc set (i, k) measured prior to that system change. Ultimately, the generation of the learning model 125 (764) includes a mapping of the performance metric 107 (which includes the plurality of values of performance conditions) to a particular command 109, which can be a refill command or a maintain command or a command to change a configuration of the optical system 105.

As mentioned, the procedure 760 can also include the optional procedure 766 of testing the learning model 125. The learning model 125 can be tested 766 before it is used by the decision module 127 to ensure that the learning model 125 is operating with a suitable set of output constraints. The testing 766 can be performed to determine the accuracy of the learning model 125. For example, the testing 766 might determine that the learning model 125 correctly predicted that a gas refill was unnecessary 58% of the time, and thus led to savings 58% of the time. The testing 766 might determine that the learning model 125 correctly predicted that a gas refill was necessary 28% of the time. The testing 766 might determine that the learning model 125 incorrectly predicted that a gas refill was necessary 6% of the time and that the learning model 125 incorrectly predicted that a gas refill was unnecessary 8% of the time. In this example, the learning model 125 is 86% accurate. The result of the testing 766 can be used to adjust the learning model 125 so that the percentage of time that the learning model 125 incorrectly predicted that the gas refill was unnecessary is less than a lower value such as 3%. By adjusting the learning model 125 in this manner, risk of damage to the optical system 105 when the learning model 125 incorrectly predicts that a gas refill is unnecessary can be reduced. The learning model 125 can be adjusted with the use of a configurable parameter that adjusts the separating hyperplane in the learning model 125, and this adjustment makes the decisions of the learning model 125 more conservative.

In some implementations, the adjustment is made by changing the threshold value to a value slightly offset from 0. For example, if the adjustment aims to bias the learning model 125 to make more positive decisions (so the first positive class of +1), then the threshold value can be changed to −0.2. In other implementations, the adjustment is made by inserting a penalty function during the procedure 760, the penalty function assigning a penalty score to each of the possible outcomes, and then each observation during training is scaled by the penalty function, such that the generated learning model 125 becomes inherently biased toward outcomes having lowest penalty coefficients.

Additionally, in some implementations, the training module 652 generates the learning model 125 (764) also based on a type, a configuration, and/or an age of the optical system 105. This information can be obtained from the interface module 360, which can monitor the optical system 105. For example, it is possible that some performance conditions would improve with a gas refill for a relatively newer optical system 105 while other performance conditions would improve with a gas refill for a relatively older optical system 105. As another example, MO Dropouts are commonly associated with the end of life of the gas discharge chamber 523A of the master oscillator system 522A within the optical system 505. Thus, if the learning model 125 receives information indicating that MO Dropouts are occurring at a high rate and also that the chamber 523A is old, then the learning model 125 is unlikely to attribute problems of the optical system 505 with health of the gas mixture 520A within the chamber 523A. On the other hand, if the learning model 125 receives information indicating that MO Dropouts of the master oscillator system 522A are occurring at a high rate and the chamber 523A is new, then the learning model 125 is more likely to conclude that the problems of the optical system 505 are related to the health of the gas mixture 520A within the chamber 523A.

Figure 8:
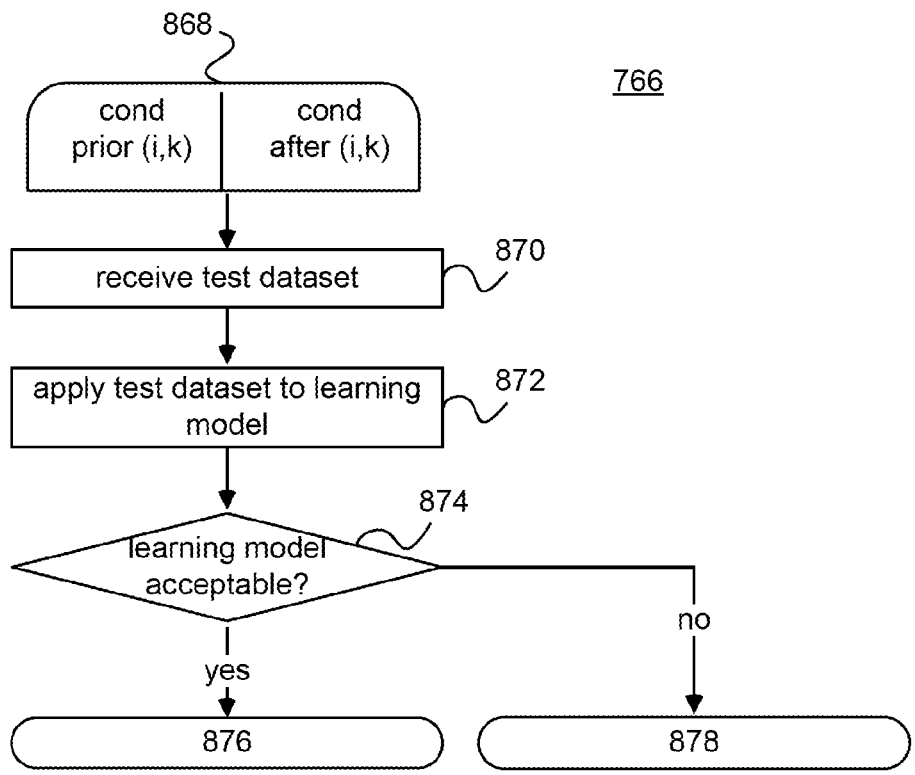
FIG. 8 is a flow chart of an implementation of a procedure for testing the learning model built using, for example, the procedure of FIG. 7.

Referring to FIG. 8, the procedure 766 of testing the learning model 125 is performed. The procedure 766 can be performed by a dedicated testing module. The procedure 766 includes receiving a test dataset 868 (870). The test dataset 868 includes a set of values of test performance conditions pc-t set (i, k) measured prior to a set of system changes k and a set of values of the test performance conditions pc-t set (i, k) measured after the set of system changes k. The test dataset 868 can be created in a manner similar to the training dataset 654, except that the test dataset 868 is not used during the training procedure 760. In this way, the test dataset 868 does not bias the training procedure 760 in its favor.

Next, the test dataset 868 is applied to the learning model 125 produced from the training procedure 760 (872). The test dataset 868 can be applied to the learning model 125 by inputting the values of the test performance conditions pc-t set (i, k) that were measured prior to the set of system changes k into the learning model 125 and then estimating the effectiveness 129 of each system change (for example, each gas refill of a gas mixture 120 or each change in configuration) of an optical system 105 (872). The effectiveness 129 is a prediction regarding whether the system change (that is, the gas refill or the change in configuration) would cause an acceptable reduction in error rates of the performance conditions of the optical system 105.

The dedicated testing module determines whether the learning model 125 is acceptable (874) by comparing the effectiveness 129 output from the learning model 125 to the set of values of the test performance conditions pc-t set (i, k) that were actually measured after the set of system changes k. It can be determined at 874 whether the effectiveness 129 has an accuracy greater than a particular percentage. For example, the dedicated testing module determines how often the learning model 125 accurately predicts that the gas refill is necessary and how often the learning model 125 accurately predicts that the gas refill is unnecessary. As another example, the dedicated testing module can compare the accuracy of the effectiveness 129 using the test performance conditions pc-t set (i, k) with the accuracy of the effectiveness 129 using the training dataset 654. The learning model 125 can be considered as well-fit and generalizable if these two accuracies are within a few percentage points of each other. The effectiveness 129 output from the dedicated testing module indicates whether the system change would significantly reduce errors in the values of the test performance conditions and this is compared to the set of values of the test performance conditions pc-t set (i, k) that were actually measured after the set of system changes k.

If the dedicated testing module determines that the learning model 125 is acceptable (874), then the learning model 125 is output for use by the decision module 127 (876). If, on the other hand, the dedicated testing module determines that the learning model 125 resulted in too many incorrect predictions, then the dedicated testing module can adjust the learning model 125 reduce the number of incorrect predictions (878).

Figure 9:
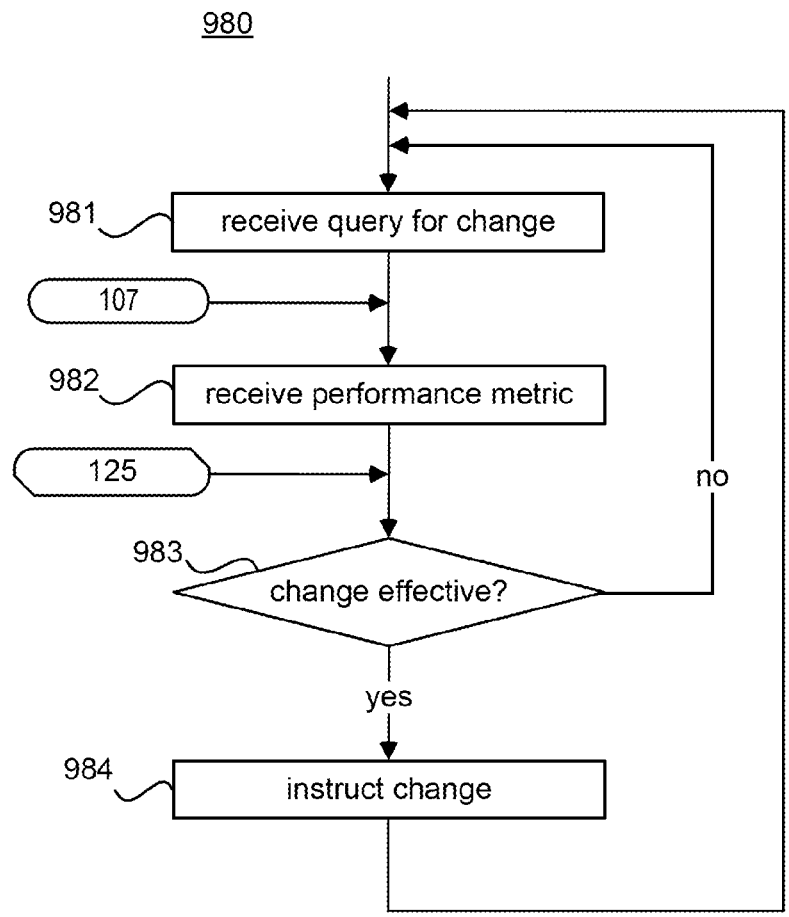
FIG. 9 is a flow chart of an implementation of a procedure performed by the predictive apparatus of FIG. 1 or 3 for predicting whether a proposed change to an optical system would improve operation of the optical system.

Referring to FIG. 9, a procedure 980 is performed by the decision module 127 for predicting whether a proposed system change of the optical system 105 would improve operation of the optical system 105. For example, the procedure 980 predicts whether one or more changes within the optical system 105 would improve operation of the optical system 105. The one or more changes include a gas refill of the gas mixture 120 within the optical system 105, a change in configuration of the optical system 105, and both a gas refill of the gas mixture 120 and a change in configuration of the optical system 105.

The decision module 127 receives a query regarding whether a status change of the optical system 105 can be made (981). The query (981) can be regularly occurring, for example, it can happen at a set frequency, and the frequency can depend on factors such as the health or age of the optical system 105. For example, the query (981) can happen every few minutes, every few hundred minutes, or every few days. The query (981) can be generated external to the optical system 105, or it can be generated by the output apparatus 115 under certain circumstances, or the query (981) can be generated by a field engineer or operator. The query (981) can be generated when a monitored aspect of the optical system 105 or the output apparatus 115 rises above a threshold value.

For example, the query (981) can be generated when a performance condition error rate rises above a threshold value. The performance condition error rate can be a rate of errors of a set of performance conditions of the optical system 105. The performance condition error rate can be determined from the output of the metrology module 360. The query (981) can be generated by the interface module 360 and supplied to the decision module 127.

The query (981) can include a request for a gas refill of the gas mixture 120 of the optical system 105.

Once a query is received (981), the decision module 127 receives the performance metric 107, for example, from the interface module 360 (982). The decision module 127 estimates, based on the performance metric 107 and the predetermined learning model 125, the effectiveness 129 of the proposed system change (for example, the proposed gas refill of the gas mixture 120) of the optical system 105 (983). The decision module 127 (via the learning model 125) is therefore configured to estimate the effectiveness 129 of the proposed gas refill of the gas mixture 120 prior to performing the gas refill so that an unnecessary gas refill is avoided or a necessary gas refill is performed. The decision module 127 can also determine whether it makes more sense to change a configuration of the optical system 105 in order to improve the operation of the optical system 105 (instead of or in addition to performing a gas refill).

The decision module 127 instructs 109 a gas refill in the optical system 105 if it is estimated (982) that the proposed gas refill would be effective (984).

The decision module 127 can instruct the gas refill (984) by, for example, outputting a gas refill command 109 to the optical system 105 instructing the optical system 105 to refill the gas mixture.

The procedure 980 can also include delaying the gas refill (represented by the return to step 981) if it is estimated (983) that the proposed gas refill would not be effective 129. Moreover, the decision module 127 can alternatively delay of the gas refill by outputting a maintain command 109 to the optical system 105 to extend use of the gas mixture. The decision module 127 can alternatively instruct or suggest a change in a configuration of the optical system 105 if it determines that a particular change in configuration would result in an improvement to operation of the optical system 105.

Thus, once the decision module 127 has decided to delay the gas refill (and extend the life of the gas mixture 12), the procedure 980 returns to await a further status change query (981), at which point the decision module 127 receives the performance metric 107 (982), and estimates the effectiveness 129 of a proposed system change to the optical system 105 (983). In this way, the gas mixture 120 is used as much as possible but not overused. The monitoring apparatus 100 allows the optical system 105 to optimize the use of the gas mixture 120. Moreover, the monitoring apparatus 100 encourages conservation of resources and provides the possibility of reducing the number of gas refills.

The decision module 127 can estimate the effectiveness 129 of the proposed refill by determining or estimating whether the performance conditions of the light beam 110 produced by the optical system 105 would be improved by the gas refill. For example, the decision module 127, using the learning model 125, determines whether a rate of errors in the beam quality would be reduced as a result of performing the gas refill.

The performance conditions that are monitored and included in the performance metric 107 include one or more of: types of beam quality errors in the light beam 110, number of occurrences of a discharge event in the gas mixture 120 over a period of time, one or more faults associated with the errors in beam quality of the light beam 110, the beam quality of the light beam 110, and errors in the beam quality of the light beam 110. The performance conditions can include a count of discharge events in the gas mixture 120 over a period of time or use. The performance conditions that are monitored can include all of the error events, that is, the events in which an operating parameter or characteristic of the light beam 110 or the optical system 105 exceeds a threshold, as well as the meta data associated with each error event. The performance conditions can also include the scores output from the fault signature algorithms for each of the error events to thereby classify each error event into known failure modes or failure signatures. Additionally, the performance conditions can include changes in the configuration of the optical system 105.

Figure 10A:
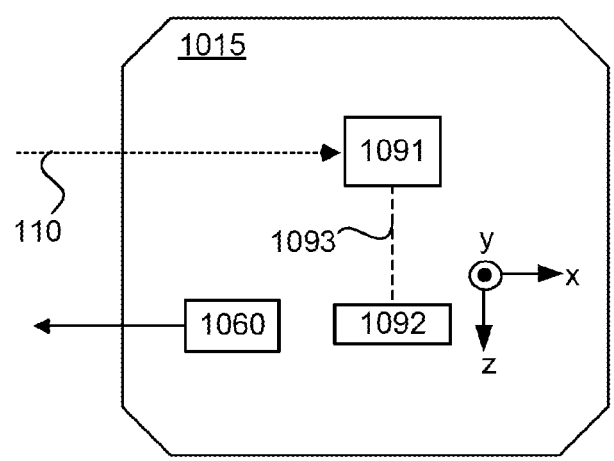
FIG. 10A is a block diagram of an implementation of a lithography exposure apparatus configured to receive a light beam produced by the optical system of FIGS. 1 and 3.
Figure 10B:
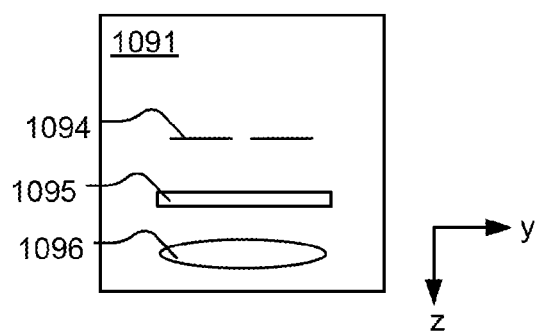
FIG. 10B is a block diagram of an implementation of a projection optical system within the lithography exposure apparatus of FIG. 10A.

Referring to FIGS. 10A and 10B, an implementation 1015 of the output apparatus 115 is shown. In this implementation, the output apparatus 115 is a lithography exposure apparatus 1015 that includes a projection optical system 1091 through which the light beam 110 passes prior to reaching the wafer 1092, and a sensor system or metrology system that includes a sensor 1060. The lithography exposure apparatus 1015 can be a liquid immersion system or a dry system.

The sensor 1060 can be a part of or communicate with the metrology module 360. The sensor 1060 can be, for example, a camera or other device that is able to capture an image of the light beam 110 at the wafer 1092, or an energy sensor that is able to capture data that describes the amount of optical energy at the wafer 1092 in the x-y plane.

Microelectronic features are formed on the wafer 1092 by, for example, exposing a layer of radiation-sensitive photoresist material on the wafer 1092 with an exposure beam 1093 output from the projection optical system 1091. Referring specifically to FIG. 10B, the projection optical system 1091 includes a slit 1094, a mask 1095, and a projection objective, which includes a lens system 1096. The lens system 1096 includes one or more optical elements. The light beam 110 enters the lithography exposure apparatus 1015 and impinges on the slit 1094, and at least some of the beam 110 passes through the slit 1094 to form the exposure beam 1093. In the example of FIGS. 10A and 10B, the slit 1094 is rectangular and shapes the light beam 110 into an elongated rectangularly shaped light beam (the exposure beam 1093). A pattern is formed on the mask 1095, and the pattern determines which portions of the shaped light beam are transmitted by the mask 1095 and which are blocked by the mask 1095. The design of the pattern is determined by the specific microelectronic circuit design that is to be formed on the wafer 1092.

The decision module 127 does not consider only the error rate of the performance conditions in determining whether to trigger a gas refill. Rather, the decision module 127 also uses information within the performance metric 107 relating to the types or kinds of errors to estimate whether a gas refill would be effective.

Next, an example of a performance metric 107 is discussed. The performance metric 107 can include fewer elements or more elements than what is discussed next, and this example is not meant to be limiting.

In the example, one or more of the following data is used to define the performance metric 107: a first set of meta data, $\kappa_{meta}$, which includes data relating to error events (BQs) and/or status relating to the optical system; a second set of data $\kappa_{FSD}$, which includes a set of scores for each error event BQ, the scores classifying the error event BQ into known fault signatures; and a third set of data $\kappa_{config}$, which includes a set of possible/probing changes to a configuration of the optical system 105. The performance metric 107 is built from one or more of these sets of data, as discussed next.

In some implementations, the performance metric 107 is built from two of these sets of data, specifically, the first set of meta data $\kappa_{meta}$ and the second set of data $\kappa_{FSD}$. This is discussed next.

The first set of meta data, $\kappa_{meta}$, can include the following information: shotsGas, which is the total number of pulses of energy supplied to the gas mixture 320 since the last gas refill; shotsChamber, which is the total number of pulses of energy supplied to any gas mixture 320 within the gas discharge chamber 323 since the gas discharge chamber 323 was initially installed in the optical source 340; and typeBQ, which is the type of performance condition associated with the error event. It is possible for the first set of meta data $\kappa_{meta}$ to include less information or more information than what is listed.

The second set of data $\kappa_{FSD}$ can include scoresFSD, which is the set of scores determined for each error event BQ output from the fault signature sub-module 360A within the interface module 360.

Each performance condition error event BQ generates a first set of meta data $\kappa_{meta}$ and a second set of data $\kappa_{FSD}$. For example, if there are 20 performance condition error events BQs before a gas refill, there will be 20 rows, each containing one or more columns corresponding to the meta data and the set of scores output from the fault signature sub-module 360A to form a matrix. This matrix information can be further transformed into a linear array $\kappa$ for use as the performance metric 307 for the learning model 125, as follows.

An assumption can be made that the data for shotsGas and shotsChamber should not change significantly between the performance condition error events BQs in such a small window of time before the proposed gas refill. Therefore, the value of shotsGas and shotsChamber at the time of the gas refill can be used in the first set of meta data, $\kappa_{meta}$, for the input into the linear array $\kappa$.

For the data typeBQ, the corresponding input is defined as a fraction of the performance condition error events BQs assigned to each type of performance condition error event. An illustration is provided next. In this particular example, there are five performance condition error events, 3 error events for energy E of the light beam 110, 1 error event for the wavelength W of the light beam 110, and 1 error event for the bandwidth B of the light beam 110. This data transforms into a 1×3 array [0.6, 0.2, 0.2], which can be used in the first set of meta data, $\kappa_{meta}$, as follows:

|     | E | W | B |        | E | W | B |
| --- | --- | --- | --- | --- | --- | --- | --- |
| BQ1 | 1 | 0 | 0 |        |   |   |   |
| BQ2 | 1 | 0 | 0 | yields |   |   |   |

|     | E | W | B |   | E   | W   | B   |
|-----|---|---|---|---|-----|-----|-----|
| BQ3 | 0 | 1 | 0 | → | 0.6 | 0.2 | 0.2 |
| BQ4 | 1 | 0 | 0 |   |     |     |     |
| BQ5 | 0 | 0 | 1 |   |     |     |     |

Moreover, the input corresponding to scoresFSD is transformed in this same way, resulting in a 1×β array, where each element in the array represents the fraction of BQs identified in each of the β fault signatures, and β corresponds to the number of fault signatures in the set of fault signatures analyzed by the fault signature sub-module 360A. For example, β can be a value greater than 1, can be greater than 10, or can be greater than 20, and in one particular example discussed next, β is 28.

The linear array κ that can then be used as the performance metric 307 for the learning model 125 is given by a concatenation of each of the above arrays, as follows:

$$\kappa = [\kappa_{meta}\ \kappa_{FSD}], \text{ or } \kappa = [\text{shotsGas}(1\times1)\ \text{shotsChamber}(1\times1)\ \text{typeBQ}(1\times3)\ \text{scoresFSD}(1\times28)],$$

where $\kappa_{meta}=[\text{shotsGas}(1\times1)\ \text{shotsChamber}(1\times1)\ \text{typeBQ}(1\times3)]$ and $\kappa_{FSD}=[\text{scoresFSD}(1\times20)]$; shotsGas(1×1) is the total number of pulses of energy supplied to the gas mixture 320 since the last gas refill; shotsChamber (1×1) is the total number of pulses of energy supplied to any gas mixture 320 within the gas discharge chamber 323 since the gas discharge chamber 323 was initially installed in the optical source 340; typeBQ(1×3) is the linear array of three types of performance condition error events BQs; and scoresFSD(1×28) is the linear array of the 28 scores, each score determined by the fault signature sub-module 360A within the interface module 360.

This concatenated linear array κ 307 is input into the learning model 125 at step 982 of the procedure 980. The learning model 125, which can include a support vector machine, categorizes the linear array κ 307 into one of two classes related to the effectiveness 129. A first class is positive, which means that a proposed gas refill would be effective and improve performance conditions of the optical system 105; and a second class is neutral or not positive, which means that the proposed gas refill would not be effective and therefore would not improve performance conditions of the optical system 105. The decision module 127 determines the effectiveness 129 based on the determined class and outputs the command 109 to the optical system 305.

FIGS. 11A and 11B show another example of how the sub-array $\kappa_{FSD}$ can be formed. In this example, there are N BQs (performance condition error events) since the last gas refill, and each performance condition error event BQ generates 32 scores by way of the fault signature sub-module 360A, resulting in an [N×32] matrix, as shown in FIG. 11A. To put this another way, the fault signature sub-module 360A executes 32 analyses, one for each error event file associated with an error event BQ. Each column in FIG. 11A represents the likelihood score associated by each of the 32 analyses, and these likelihood scores have been tuned such that a score greater than 1 implies that the associated fault signature is believed to be present. In this example, BQ1 generates a score of 1.54 for the F101 fault signature, a score of 0.29 for the F102 fault signature, a score of 0.03 for the F103 fault signature, etc. The goal is to transform this [N×32] matrix into an [1×32] sub-array $\kappa_{FSD}$ that can be concatenated with the other sub-arrays to form the array κ that is used as the performance metric 307.

FIG. 11B shows how these likelihood scores are used by the interface module 360. In particular, the interface module 360 (via the fault signature sub-module 360A or the output sub-module 362) thresholds each score so that each element in the matrix of FIG. 11B represents a binary decision; namely, whether a fault signature is present or not. Next, the columns are summed up, so each element represents the total number of times each fault signature appeared within all of the error event files within a particular window. Then, each element is divided by the total number of error event files so each element represents a fraction that indicates how prevalent each fault signature is among the sample of error events BQs and the final form is the sub-array $\kappa_{FSD}$. As shown in FIG. 11B, if the score is greater than or equal to 1.00, then a value of 1 is designated for the score, and if the score is less than 1.00, then a value of 0 is designated for the score.

In some implementations, the linear array κ that can be used as the performance metric 307 for the learning model 125 is given not only by the concatenation of each sub-array $\kappa_{meta}$ and $\kappa_{FSD}$, but also includes a third sub-array $\kappa_{config}$ that relates to a set of configuration changes of the optical system 105: For example, the linear array κ can correspond to:

$$\kappa = [\kappa_{meta}\ \kappa_{FSD}\ \kappa_{config}].$$

This third sub-array $\kappa_{config}$ can be included in the performance metric 107 if configuration changes were used during training to form the learning model 125, because this means that the learning model 125 is equipped to analyze not only whether a proposed gas refill would improve operation of the optical system 105 but also whether certain changes in a configuration of the optical system 105 would improve operation of the optical system 105. As an example, it is possible that a gas refill appears to reduce error events associated with one or more performance conditions but the reduction in error events was actually due to a change in configuration of the optical system 105 (that transpired or overlapped in time with the gas refill during training). The learning model 125 can distinguish between which change (either a gas refill or a configuration change) or whether both changes (both a gas refill and a configuration change) would lead to an improvement in operation of the optical system 105.

In this example, the sub-array $\kappa_{config}$ can be represented by the array $[\kappa_{c1}, \kappa_{c2}, \ldots, \kappa_{c11}]$, where each $\kappa_{ci}$ corresponds to a change in a configuration parameter (Δcpi) of the optical system 105. An example of the values of $\kappa_{ci}$ are shown in a table in FIG. 12 for the optical system 105, which can be the optical system 305 shown in FIG. 3, or the optical system 505 such as shown in FIG. 5. In the table of FIG. 12, for example, $\kappa_{c1}$ corresponds to a change in the concentration of one of the components within the chamber 323/523A/523B of the respective gas subsystem 322/522A/522B, respectively; $\kappa_{c2}$ corresponds to a change in the concentration of another of the components within the chamber 323/523A/523B of the respective gas subsystem 322/522A/522B; $\kappa_{c3}$ corresponds to a change in a property relating to how components are injected into the chamber 323/523A/523B of the respective subsystem 322/522A/522B; and $\kappa_{c8}$ corresponds to a change in a target temperature associated with a component of the optical system 305 or 505.

Thus, in this example, the decision module 127 also considers these configuration changes when determining an effectiveness 129 of a gas refill or a configuration change to the optical system 105. For example, as discussed above, it is possible that a gas refill reduces an error rate of one of the error events BQs that is most related to gas health (such as dropout on the master oscillator system 522A). But, it is also possible that the reduction in the error rate of the error event BQ (in this case dropout on the master oscillator system 522A) is also driven by a configuration change in addition to or in spite of the gas refill. For example, a change in temperature of the chamber 523A of the master oscillator system 522A may lead to a reduction in error rate of the MO Dropout on the master oscillator system 522A.

Other implementations are within the scope of the claims.

For example, in other implementations, the learning model 125 includes a neural network, a decision tree, a K-nearest neighbor model (instead of a support vector machine), or any other machine learning model with a similar input/output structure. Aspects of the learning model include assembling a dataset, assembling an input vector with fault signature detection (FSD), training the dataset, testing the dataset, and then applying the learning model.

Other aspects of the invention are set out in the following numbered clauses.

1. An apparatus comprising:
  a decision module configured to:
    receive a performance metric relating to performance conditions of an optical system emitting a light beam;
    estimate, based on the performance metric and a predetermined learning model, an effectiveness of a proposed change to the optical system; and
    output a change command to the optical system if it is estimated that the proposed change to the optical system would be effective.

2. The apparatus of clause 1, wherein the decision module is configured to output a maintain command to the optical system if the decision module estimates that the proposed change to the optical system would not be effective.

3. The apparatus of clause 1, wherein the decision module is configured to estimate the effectiveness of the proposed change by determining whether the performance conditions of the light beam would be improved.

4. The apparatus of clause 3, wherein determining whether the performance conditions of the light beam are improved comprises determining whether a rate of errors in the beam quality would be reduced.

5. The apparatus of clause 1, wherein the performance conditions include one or more of: types of beam quality errors in the light beam, number of occurrences of a discharge event in the gas mixture over a period of time, one or more faults associated with the errors in beam quality of the light beam, the beam quality of the light beam, errors in the beam quality of the light beam, error events associated with operating parameters or characteristics of the light beam, analyses of each error event relative to fault signatures, and changes in a configuration of the optical system.

6. The apparatus of clause 1, wherein the decision module is configured to estimate the effectiveness of the proposed change prior to the change to the optical system being effected.

7. The apparatus of clause 1, further comprising an interface module in communication with the decision module, the interface module providing the performance metric, wherein the interface module comprises a plurality of beam quality detection modules, the plurality of beam quality detection modules comprising:
  one or more spectral feature detection modules each configured to detect an error in a respective spectral feature of the light beam and to produce an error event signal that indicates the respective spectral feature error of the light beam; and
  an energy detection module configured to detect an error in an energy of the light beam and to produce an error event signal that indicates the energy error of the light beam;
  wherein the spectral feature includes a bandwidth or a wavelength of the light beam and wherein the performance metric is produced based on the error events in the respective spectral features and energy.

8. The apparatus of clause 7, wherein the interface module comprises:
  a discharge count detection module configured to detect an occurrence of a discharge event in a gas mixture of the optical system, and to produce a signal that indicates a count of discharge events over a period of time, wherein the performance metric includes data relating to the produced signal from the discharge detection module.

9. The apparatus of clause 8, wherein the period of time is measured since the last time the gas mixture was refilled or is measured since one or more chambers containing the gas mixture are added to the optical system.

10. The apparatus of clause 7, wherein the interface module comprises:
  a fault signature module configured to analyze each beam quality error event relative to a set of fault signatures, and to produce a likelihood score that classifies the beam quality error event into known fault signatures, wherein the performance metric includes data relating to the output from the fault signature module.

11. The apparatus of clause 1, wherein the predetermined learning model receives as an input the performance metric and outputs the estimate.

12. The apparatus of clause 1, wherein the predetermined learning model is a support vector machine.

13. The apparatus of clause 12, wherein the predetermined learning model includes a separating hyperplane, the hyperplane classifying the performance metric as either a yes or a no, in which a yes classification indicates that the proposed change would be effective and a no classification indicates that the proposed change would not be effective.

14. The apparatus of clause 1, wherein the predetermined learning model is built based on a type, a configuration, and/or an age of the optical system.

15. The apparatus of clause 1, wherein the estimate of the effectiveness of the proposed change indicates whether performance conditions of the optical system after the proposed change improve relative to the conditions of the optical system prior to the proposed change.

16. The apparatus of clause 1, wherein the decision module is configured to estimate the effectiveness of the proposed change by comparing performance conditions of the optical system after the proposed change to performance conditions of the optical system before the proposed change, wherein the decision module is configured to output the change command if the comparison indicates that the performance conditions would improve by a predetermined amount.

17. The apparatus of clause 1, wherein the proposed change to the optical system comprises one or more of a proposed refill of a gas mixture within the optical system and a proposed change in a configuration of the optical system.

18. The apparatus of clause 17, wherein the decision module is configured to estimate the effectiveness of a proposed refill of the gas mixture within the optical system based also on probed changes to the configuration of the optical system.

19. A method comprising:

receiving a training dataset based on a plurality of test optical systems, the training dataset includes, for each of a plurality of changes of each test optical system:
   a plurality of values of performance conditions relating to the test optical system prior to the change; and
   a plurality of values of the performance conditions relating to the test optical system after the change; and
generating, based on the training dataset, a prediction model that estimates an effectiveness of a proposed change in an optical system based on a performance metric relating to performance conditions of the optical system.

20. The method of clause 19, wherein generating the prediction model includes comparing, for each change, the plurality of values of the performance conditions relating to the test optical system after the change to the plurality of values of the performance conditions relating to the test optical system prior to the change, the comparison indicating the effectiveness of the change.

21. The method of clause 19, wherein the prediction model is a learning model.

22. The method of clause 21, wherein the learning model includes a support vector machine.

23. The method of clause 19, wherein generating the prediction model comprises mapping the performance metric to one of a maintain command or a change command, the maintain command and the change command being based on the estimated effectiveness of the proposed change to the optical system.

24. The method of clause 19, wherein the training dataset includes at least several thousand changes from the plurality of test optical systems.

25. The method of clause 19, wherein the performance conditions include one or more of: rates of beam quality errors of a light beam produced from the optical system, types of beam quality errors of a light beam produced from the optical system, number of occurrences of a discharge event in the gas mixture of the optical system over a period of time, one or more faults associated with the errors in the beam quality of the light beam produced from the optical system, anomalies in operating efficiency of the optical system, errors in one or more spectral features of the light beam produced from the optical system, error events associated with operating parameters or characteristics of the light beam, analyses of each error event relative to fault signatures, and changes in a configuration of the optical system.

26. The method of clause 19, further comprising testing the prediction model before applying a performance metric relating to performance conditions of the optical system to the prediction model, wherein testing the prediction model comprises:
   using a test dataset that includes, for each of a plurality of changes and each of a plurality of test optical systems, a plurality of values of performance conditions relating to the test optical system prior to the change and a plurality of values of the performance conditions relating to the test optical system after the change, the test dataset being excluded from the training dataset, and
   applying the plurality of values of performance conditions relating to the test optical system prior to the change to the prediction model and comparing each actual output of the prediction model to the associated value of the performance condition relating to the test optical system after the change from the test dataset.

27. The method of clause 19, wherein the estimate of the effectiveness of the proposed change indicates whether performance conditions of the optical system after the proposed change improve relative to the conditions of the optical system prior to the proposed change.

28. The method of clause 19, further comprising tuning the prediction model to reduce a likelihood that the prediction model estimates that the proposed change would not be effective.

29. The method of clause 19, wherein generating the prediction model is also based on a type, a configuration, and/or an age of the optical system.

30. The method of clause 19, wherein the prediction model is configured to estimate the effectiveness of the proposed change to the optical system.

31. The method of clause 19, wherein the proposed change to the optical system comprises one or more of a proposed refill of a gas mixture within the optical system and a proposed change in a configuration of the optical system.

32. The method of clause 19, wherein the optical system is distinct from the test optical system.

33. A method comprising:
   receiving a performance metric relating to performance conditions of an optical system emitting a light beam;
   estimating, based on the performance metric and a predetermined learning model, an effectiveness of a proposed change to the optical system; and
   instructing a change to the optical system if it is estimated that the proposed change would be effective.

34. The method of clause 33, wherein instructing the change to the optical system comprises outputting a change command to the optical system.

35. The method of clause 33, further comprising delaying the change if it is estimated that the proposed change would not be effective.

36. The method of clause 35, wherein delaying the change comprises outputting a maintain command to the optical system.

37. The method of clause 35, further comprising, after delaying the change:
   receiving a performance metric relating to performance conditions of the optical system; and estimating, based on the performance metric and the predetermined learning model, the effectiveness of a proposed change the optical system.

38. The method of clause 33, wherein estimating the effectiveness of the proposed change comprises determining whether the performance conditions of the light beam would be improved.

39. The method of clause 38, wherein determining whether the performance conditions of the light beam are improved comprises determining whether a rate of errors in the beam quality would be reduced.

40. The method of clause 33, wherein the performance conditions include one or more of:
   types of beam quality errors in the light beam, number of occurrences of a discharge event in the gas mixture over a period of time, one or more faults associated with the errors in beam quality of the light beam, the beam quality of the light beam, errors in the beam quality of the light beam, error events associated with operating parameters or characteristics of the light beam, analyses of each error event relative to fault signatures, and changes in a configuration of the optical system.

41. The method of clause 33, wherein the predetermined learning model is configured to estimate the effectiveness of the proposed change prior to effecting the change to the optical system.

42. The method of clause 33, wherein the performance conditions include a count of discharge events in the gas mixture over a period of time.

43. The method of clause 33, wherein the predetermined learning model receives as an input the performance metric and outputs the estimate.

44. The method of clause 33, wherein the predetermined learning model is a support vector machine.

45. The method of clause 44, wherein the predetermined learning model includes a separating hyperplane, the hyperplane classifying the performance metric as either a yes or a no, in which a yes classification indicates that the proposed change would be effective and a no classification indicates that the proposed change would not be effective.

46. The method of clause 44, wherein the estimate of the effectiveness of the proposed change indicates whether conditions of the optical system after the proposed change improve relative to the conditions of the optical system prior to the proposed change.

47. The method of clause 33, wherein the proposed change to the optical system comprises one or more of a proposed refill of a gas mixture within the optical system and a proposed change in a configuration of the optical system.

48. The method of clause 47, wherein estimating the effectiveness of a proposed refill of the gas mixture within the optical system is based also on possible changes to the configuration of the optical system.

49. A non-transitory computer-readable medium storing instructions that, when executed by a computer, cause it to perform the following method comprising:
receiving a training dataset based on a plurality of test optical systems, the training dataset includes, for each of a plurality of changes of each test optical system:
a plurality of values of performance conditions relating to the test optical system prior to the change; and
a plurality of values of the performance conditions relating to the test optical system after the change; and
generating, based on the training dataset, a prediction model that estimates an effectiveness of a proposed change in an optical system based on a performance metric relating to performance conditions of the optical system.

50. A non-transitory computer-readable medium storing instructions that, when executed by a computer, cause it to perform the following method comprising:
receiving a performance metric relating to performance conditions of an optical system emitting a light beam;
estimating, based on the performance metric and a predetermined learning model, an effectiveness of a proposed change to the optical system; and
instructing a change to the optical system if it is estimated that the proposed change would be effective.

51. An apparatus comprising:
a decision module configured to:
receive a performance metric relating to performance conditions of an optical system emitting a light beam;
estimate, based on the performance metric and a predetermined learning model, an effectiveness of a proposed refill of a gas mixture of the optical system; and
output a refill command to the optical system if it is estimated that the proposed refill of the gas mixture of the optical system would be effective.

52. A method comprising:
receiving a training dataset based on a plurality of test optical systems, the training dataset includes, for each of a plurality of gas refills of each test optical system:
a plurality of values of performance conditions relating to the test optical system prior to the gas refill; and
a plurality of values of the performance conditions relating to the test optical system after the gas refill; and
generating, based on the training dataset, a prediction model that estimates an effectiveness of a proposed gas refill of a gas mixture in an optical system based on a performance metric relating to performance conditions of the optical system.

53. A method comprising:
receiving a performance metric relating to performance conditions of an optical system emitting a light beam;
estimating, based on the performance metric and a predetermined learning model, an effectiveness of a proposed gas refill of a gas mixture of the optical system; and
instructing a gas refill to the optical system if it is estimated that the proposed gas refill would be effective.

54. A non-transitory computer-readable medium storing instructions that, when executed by a computer, cause it to perform the following method comprising:
receiving a training dataset based on a plurality of test optical systems, the training dataset includes, for each of a plurality of gas refills of each test optical system:
a plurality of values of performance conditions relating to the test optical system prior to the gas refill; and
a plurality of values of the performance conditions relating to the test optical system after the gas refill; and
generating, based on the training dataset, a prediction model that estimates an effectiveness of a proposed gas refill in an optical system based on a performance metric relating to performance conditions of the optical system.

55. A non-transitory computer-readable medium storing instructions that, when executed by a computer, cause it to perform the following method comprising:
receiving a performance metric relating to performance conditions of an optical system emitting a light beam;
estimating, based on the performance metric and a predetermined learning model, an effectiveness of a proposed gas refill in the optical system; and
instructing a gas refill to the optical system if it is estimated that the proposed gas refill would be effective.

The breadth and scope of the present disclosure should not be limited by any of the above-described exemplary embodiments, but should be defined only in accordance with the following claims and their equivalents.

What is claimed is:

1. An apparatus comprising:
a decision module in communication with an optical system and an interface module, comprising a predetermined learning model, and being configured to:
receive, from the interface module, a performance metric relating to performance conditions of an optical system emitting a light beam;
estimate, based on the performance metric and the predetermined learning model, an effectiveness of a proposed change to the optical system; and
output a change command to the optical system if it is estimated that the proposed change to the optical system would be effective;
wherein the predetermined learning model receives as an input the performance metric and outputs the estimate.

2. The apparatus of claim 1, wherein the decision module is configured to output a maintain command to the optical system if the decision module estimates that the proposed change to the optical system would not be effective.

3. The apparatus of claim 1, wherein the decision module is configured to estimate the effectiveness of the proposed change by determining whether the performance conditions of the light beam would be improved.

4. The apparatus of claim 1, wherein the performance conditions include one or more of: types of beam quality errors in the light beam, number of occurrences of a discharge event in the gas mixture over a period of time, one or more faults associated with the errors in beam quality of the light beam, the beam quality of the light beam, errors in the beam quality of the light beam, error events associated with operating parameters or characteristics of the light beam, analyses of each error event relative to fault signatures, and changes in a configuration of the optical system.

5. The apparatus of claim 1, wherein the decision module is configured to estimate the effectiveness of the proposed change prior to effecting the change to the optical system.

6. The apparatus of claim 1, further comprising the interface module in communication with the decision module and the optical system, the interface module providing the performance metric, wherein the interface module comprises a plurality of beam quality detection modules, the plurality of beam quality detection modules comprising:
one or more spectral feature detection modules each configured to detect an error in a respective spectral feature of the light beam and to produce an error event signal that indicates the respective spectral feature error of the light beam; and
an energy detection module configured to detect an error in an energy of the light beam and to produce an error event signal that indicates the energy error of the light beam;
wherein the spectral feature includes a bandwidth or a wavelength of the light beam and wherein the performance metric is produced based on the error events in the respective spectral features and energy.

7. The apparatus of claim 6, wherein the interface module comprises:
a fault signature module interacting with an aspect of the optical system, the fault signature module configured to analyze each beam quality error event relative to a set of fault signatures, and to produce a likelihood score that classifies the beam quality error event into known fault signatures,
wherein the performance metric includes data relating to the output from the fault signature module.

8. The apparatus of claim 1, wherein the predetermined learning model is built based on a type, a configuration, and/or an age of the optical system.

9. The apparatus of claim 1, wherein the proposed change to the optical system comprises one or more of a proposed refill of a gas mixture within the optical system and a proposed change in a configuration of the optical system.

10. The apparatus of claim 9, wherein the decision module is configured to estimate the effectiveness of a proposed refill of the gas mixture within the optical system based also on probed changes to the configuration of the optical system.

11. A method comprising:
receiving a training dataset based on a plurality of test optical systems, the training dataset includes, for each of a plurality of changes of each test optical system:
a plurality of values of performance conditions relating to the test optical system prior to the change; and
a plurality of values of the performance conditions relating to the test optical system after the change; and
generating, based on the training dataset, a prediction model that estimates an effectiveness of a proposed change in an optical system based on a performance metric relating to performance conditions of the optical system.

12. The method of claim 11, wherein generating the prediction model includes comparing, for each change, the plurality of values of the performance conditions relating to the test optical system after the change to the plurality of values of the performance conditions relating to the test optical system prior to the change, the comparison indicating the effectiveness of the change.

13. The method of claim 11, wherein generating the prediction model comprises mapping the performance metric to one of a maintain command or a change command, the maintain command and the change command being based on the estimated effectiveness of the proposed change to the optical system.

14. The method of claim 11, wherein the performance conditions include one or more of: rates of beam quality errors of a light beam produced from the optical system, types of beam quality errors of a light beam produced from the optical system, number of occurrences of a discharge event in the gas mixture of the optical system over a period of time, one or more faults associated with the errors in the beam quality of the light beam produced from the optical system, anomalies in operating efficiency of the optical system, errors in one or more spectral features of the light beam produced from the optical system, error events associated with operating parameters or characteristics of the light beam, analyses of each error event relative to fault signatures, and changes in a configuration of the optical system.

15. The method of claim 11, wherein the estimate of the effectiveness of the proposed change indicates whether performance conditions of the optical system after the proposed change improve relative to the conditions of the optical system prior to the proposed change.

16. The method of claim 11, further comprising tuning the prediction model to reduce a likelihood that the prediction model estimates that the proposed change would not be effective.

17. The method of claim 11, wherein the prediction model is configured to estimate the effectiveness of the proposed change to the optical system.

18. The method of claim 11, wherein the proposed change to the optical system comprises one or more of a proposed refill of a gas mixture within the optical system and a proposed change in a configuration of the optical system.

19. A method comprising:
receiving a performance metric relating to performance conditions of an optical system emitting a light beam;
estimating, based on the performance metric and a predetermined learning model, an effectiveness of a proposed change to the optical system, the estimating including determining whether the performance conditions of the light beam would be improved; and
instructing a change to the optical system if it is estimated that the proposed change would be effective.

20. The method of claim 19, further comprising delaying the change if it is estimated that the proposed change would not be effective.

21. The method of claim 20, further comprising, after delaying the change:

receiving a performance metric relating to performance conditions of the optical system; and estimating, based on the performance metric and the predetermined learning model, the effectiveness of a proposed change the optical system.

22. The method of claim 19, wherein the performance conditions include one or more of: types of beam quality errors in the light beam, number of occurrences of a discharge event in the gas mixture over a period of time, one or more faults associated with the errors in beam quality of the light beam, the beam quality of the light beam, errors in the beam quality of the light beam, error events associated with operating parameters or characteristics of the light beam, analyses of each error event relative to fault signatures, and changes in a configuration of the optical system.

23. The method of claim 19, wherein the predetermined learning model is configured to estimate the effectiveness of the proposed change prior to effecting the change to the optical system.

24. The method of claim 19, wherein the performance conditions include a count of discharge events in the gas mixture over a period of time.

25. The method of claim 19, wherein the predetermined learning model is a support vector machine.

26. The method of claim 25, wherein the predetermined learning model includes a separating hyperplane, the hyperplane classifying the performance metric as either a yes or a no, in which a yes classification indicates that the proposed change would be effective and a no classification indicates that the proposed change would not be effective.

27. A non-transitory computer-readable medium storing instructions that, when executed by a computer, cause it to perform the following method comprising:
receiving a training dataset based on a plurality of test optical systems, the training dataset includes, for each of a plurality of changes of each test optical system:
a plurality of values of performance conditions relating to the test optical system prior to the change; and
a plurality of values of the performance conditions relating to the test optical system after the change; and
generating, based on the training dataset, a prediction model that estimates an effectiveness of a proposed change in an optical system based on a performance metric relating to performance conditions of the optical system.

28. A non-transitory computer-readable medium storing instructions that, when executed by a computer, cause it to perform the following method comprising:
receiving a performance metric relating to performance conditions of an optical system emitting a light beam;
estimating, based on the performance metric and a predetermined learning model, an effectiveness of a proposed change to the optical system; and
instructing a change to the optical system if it is estimated that the proposed change would be effective;
wherein the predetermined learning model receives as an input the performance metric and outputs the estimate.

29. An apparatus comprising:
a decision module in communication with an optical system and an interface module, the decision module configured to:
receive, from the interface module, a performance metric relating to performance conditions of an optical system emitting a light beam;
estimate, based on the performance metric and a predetermined learning model, an effectiveness of a proposed refill of a gas mixture of the optical system; and
output a refill command to the optical system if it is estimated that the proposed refill of the gas mixture of the optical system would be effective.

30. A method comprising:
receiving a performance metric relating to performance conditions of an optical system emitting a light beam;
estimating, based on the performance metric and a predetermined learning model, an effectiveness of a proposed gas refill of a gas mixture of the optical system; and
instructing a gas refill to the optical system if it is estimated that the proposed gas refill would be effective.

31. The method of claim 19, wherein determining whether the performance conditions of the light beam are improved comprises determining whether a rate of errors in the beam quality would be reduced.

32. An apparatus comprising:
a decision module in communication with an optical system and an interface module, and being configured to:
receive, from the interface module, a performance metric relating to performance conditions of an optical system emitting a light beam;
estimate, based on the performance metric and a predetermined learning model, an effectiveness of a proposed change to the optical system indicating whether performance conditions of the optical system after the proposed change improve relative to the conditions of the optical system prior to the proposed change; and
output a change command to the optical system if it is estimated that the proposed change to the optical system would be effective.

* * * * *